US008768677B2

(12) United States Patent
Teramae et al.

(10) Patent No.: US 8,768,677 B2
(45) Date of Patent: Jul. 1, 2014

(54) COUPLED ANALYSIS SIMULATION APPARATUS AND COUPLED ANALYSIS SIMULATION METHOD

(75) Inventors: Kumiko Teramae, Kawasaki (JP); Atsushi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 437 days.

(21) Appl. No.: 12/899,135

(22) Filed: Oct. 6, 2010

(65) Prior Publication Data

US 2011/0082681 A1 Apr. 7, 2011

(30) Foreign Application Priority Data

Oct. 7, 2009 (JP) .................................. 2009-233251

(51) Int. Cl.
*G06F 17/50* (2006.01)
*G06G 7/62* (2006.01)

(52) U.S. Cl.
USPC .............................................. 703/14; 703/13

(58) Field of Classification Search
USPC ........................................................ 703/14, 13
See application file for complete search history.

(56) References Cited

U.S. PATENT DOCUMENTS

| 6,219,629 | B1 * | 4/2001 | Namiki ............................ 703/13 |
|---|---|---|---|
| 7,027,941 | B2 | 4/2006 | Nagase et al. |
| 2001/0018761 | A1 * | 8/2001 | Sasaki et al. .................... 716/15 |
| 2005/0228601 | A1 * | 10/2005 | Nagase et al. .................. 702/66 |
| 2008/0077892 | A1 * | 3/2008 | Yamazaki et al. ................ 716/4 |
| 2009/0259452 | A1 * | 10/2009 | Takeuchi ......................... 703/14 |

FOREIGN PATENT DOCUMENTS

| JP | 11-153634 A | 6/1999 |
|---|---|---|
| JP | 2004-54642 A | 2/2004 |
| JP | 2008-059153 | 3/2008 |
| JP | 2008-217327 A | 9/2008 |
| WO | WO-2004-109560 A | 12/2004 |

OTHER PUBLICATIONS

Rueli, Albert E. et al., "Nonorthogonal PEEC Formulation for Time- and Frequency-Domain EM and Circuit Modeling", May 2003, IEEE Transactions on Electromagnetic Compatibility, vol. 45, No. 2, IEEE.*
Picket-May, Melinda et al., "FD-TD Modeling of Digital Signal Propagation in 3-D Circuits with Passive and Active Loads", Aug. 1994, IEEE Transactions on Microwave Theory and Techniques, vol. 42, No. 8, IEEE.*
"Japanese Office Action" mailed by JPO and corresponding to Japanese application No. 2009-233251 on Sep. 13, 2011, with partial English translation.

* cited by examiner

*Primary Examiner* — Kamini S Shah
*Assistant Examiner* — Cedric D Johnson
(74) *Attorney, Agent, or Firm* — Fujitsu Patent Center

(57) ABSTRACT

A coupled analysis simulation apparatus includes a coupled analysis processing unit configured to perform coupled analysis by performing electromagnetic field analysis and circuit analysis in coordination with each other, the electromagnetic field analysis being performed on a space including conductive layers to which an electronic circuit module is connected, the circuit analysis being performed on the electronic circuit module; a first generating unit configured to generate a virtual conductive part in a section or a region including connection parts connecting the electronic circuit module with the conductive layers; and a second generating unit configured to generate virtual connection parts that virtually connect the virtual conductive part with the conductive layers at positions where the connection parts are connected to the conductive layers.

20 Claims, 33 Drawing Sheets

FIG.4A

| NO. | LAYER | SIGNAL TYPE | DATA RATE | DIELECTRIC CONSTANT | WIRING WIDTH (mm) | WIRING HEIGHT (mm) | STARTING POINT COORDINATES (mm) | | ENDING POINT COORDINATES (mm) | |
|---|---|---|---|---|---|---|---|---|---|---|
| | | | | | | | X | Y | X | Y |
| 1 | 1 | data001 | 1e** | 3.8 | 0.1 | 0.035 | A1 | B1 | C1 | D1 |
| 2 | 1 | data001 | 1e** | 3.8 | 0.1 | 0.035 | A2 | B2 | C2 | D2 |
| 3 | 4 | data001 | 1e** | 3.8 | 0.1 | 0.035 | A3 | B3 | C3 | D3 |
| ... | ... | ... | ... | ... | ... | ... | ... | ... | ... | ... |
| N | 1 | data** | 1e** | 3.8 | 0.1 | 0.035 | ... | ... | ... | ... |

FIG.4B

| NO. | LAYER | V/G | DIELECTRIC CONSTANT | HEIGHT OF CONDUCTIVE LAYER (mm) | INTERVAL BETWEEN LAYERS (mm) |
|---|---|---|---|---|---|
| 1 | 2 | V | 3.8 | 0.035 | 0.255 |
| 2 | 3 | G | 3.8 | 0.035 | 0.255 |

FIG.4C

| NO. | LAYER | TYPE OF MODULE | HEIGHT (mm) | TERMINAL 1 (mm) | | TERMINAL 2 (mm) | | TERMINAL 3 (mm) | | TERMINAL 4 (mm) | | TERMINAL 5 (mm) | | ... | TERMINAL N (mm) | |
|---|---|---|---|---|---|---|---|---|---|---|---|---|---|---|---|---|
| | | | | Xt1 | Yt1 | Xt2 | Yt2 | Xt3 | Yt3 | Xt4 | Yt4 | Xt5 | Yt5 | | Xtn | Ytn |
| 1 | 1 | lsi001 | h1 | A11 | B11 | C11 | D11 | E11 | F11 | G11 | H11 | I11 | J11 | ... | ... | ... |
| 2 | 1 | pass001 | h2 | A12 | B12 | C12 | D12 | E12 | F12 | G12 | H12 | I12 | J12 | ... | ... | ... |
| 3 | 1 | lsi002 | h3 | A13 | B13 | C13 | D13 | E13 | F13 | G13 | H13 | I13 | J13 | ... | ... | ... |
| ... | ... | ... | ... | ... | ... | ... | ... | ... | ... | ... | ... | ... | ... | ... | ... | ... |
| N | 1 | pass*** | ... | ... | ... | ... | ... | ... | ... | ... | ... | ... | ... | ... | ... | ... |

FIG.8A

| NO. | COORDINATES OF VERTEX 1 (mm) | | COORDINATES OF VERTEX 2 (mm) | | COORDINATES OF VERTEX 3 (mm) | | COORDINATES OF VERTEX 4 (mm) | | LAYER NUMBER | HEIGHT h (μm) |
|---|---|---|---|---|---|---|---|---|---|---|
| | X | Y | X | Y | X | Y | X | Y | | |
| 1 | A21 | B21 | C21 | D21 | E21 | F21 | G21 | H21 | 1 | +h11 |
| 2 | A22 | B22 | C22 | D22 | E22 | F22 | G22 | H22 | 1 | +h12 |
| 3 | A23 | B23 | C23 | D23 | E23 | F23 | G23 | H23 | 4 | −h13 |
| 4 | A24 | B24 | C24 | D24 | E24 | F24 | G24 | H24 | 4 | −h14 |
| 5 | A25 | B25 | C25 | D25 | E25 | F25 | G25 | H25 | 1 | +h15 |
| 6 | A26 | B26 | C26 | D26 | E26 | F26 | G26 | H26 | 4 | −h16 |
| ... | ... | ... | ... | ... | ... | ... | ... | ... | ... | ... |

FIG.8B

| NO. | X (mm) | Y (mm) | LAYER NUMBER | HEIGHT h ($\mu$m) |
|---|---|---|---|---|
| 1 | A31 | B31 | 1 | +h11 |
| 2 | A32 | B32 | 1 | +h11 |
| 3 | A33 | B33 | 1 | +h11 |
| 4 | A34 | B34 | 1 | +h11 |
| 5 | A35 | B35 | 1 | +h11 |
| 6 | A36 | B36 | 4 | −h12 |
| ⋮ | ⋮ | ⋮ | ⋮ | ⋮ |

FIG.9

```
****linkage element ****
a1 t1 0 id=n end
```

FIG.11A

| X | Y | Z | DIELECTRIC CONSTANT | ELECTRIC CONDUCTIVITY | MAGNETIC PERMEABILITY | MAGNETIC RESISTIVITY | DENSITY |
|---|---|---|---|---|---|---|---|
| 1 | 1 | 1 | S11 | T11 | U11 | V11 | W11 |
| 1 | 1 | 2 | S12 | T12 | U12 | V12 | W12 |
| 1 | 1 | 3 | S13 | T13 | U13 | V13 | W13 |
| ... | ... | ... | ... | ... | ... | ... | ... |

FIG.11B

| X | Y | Z | IDENTIFIER OF COUPLING DEVICE (NO.) |
|---|---|---|---|
| K1 | L1 | M1 | 1 |
| K2 | L2 | M2 | 2 |
| K3 | L3 | M3 | 3 |
| ... | ... | ... | ... |

FIG.13

| NO. | ELECTRIC FIELD VALUE $E^k$ | CURRENT VALUE $I^k$ |
|---|---|---|
| 1 | N1 | O1 |
| 2 | N2 | O2 |
| 3 | N3 | O3 |
| 4 | N4 | O4 |
| 5 | N5 | O5 |
| 6 | N6 | O6 |
| 7 | N7 | O7 |
| ⋮ | ⋮ | ⋮ |

FIG.15

| X | Y | Z | $E^k$ | $H^{(k+1/2)}$ |
|---|---|---|----|------------|
| 1 | 1 | 1 | P1 | Q1 |
| 1 | 1 | 2 | P2 | Q2 |
| 1 | 1 | 3 | P3 | Q3 |
| ⋮ | ⋮ | ⋮ | ⋮  | ⋮  |

$tem01 = (k-1/2) \times \Delta t$ $tem02 = k \times \Delta t$

FIG.16

| X | Y | Z | $I^k$ |
|---|---|---|----|
| 1 | 1 | 1 | R1 |
| 1 | 1 | 2 | R2 |
| 1 | 1 | 3 | R3 |
| ⋮ | ⋮ | ⋮ | ⋮  |

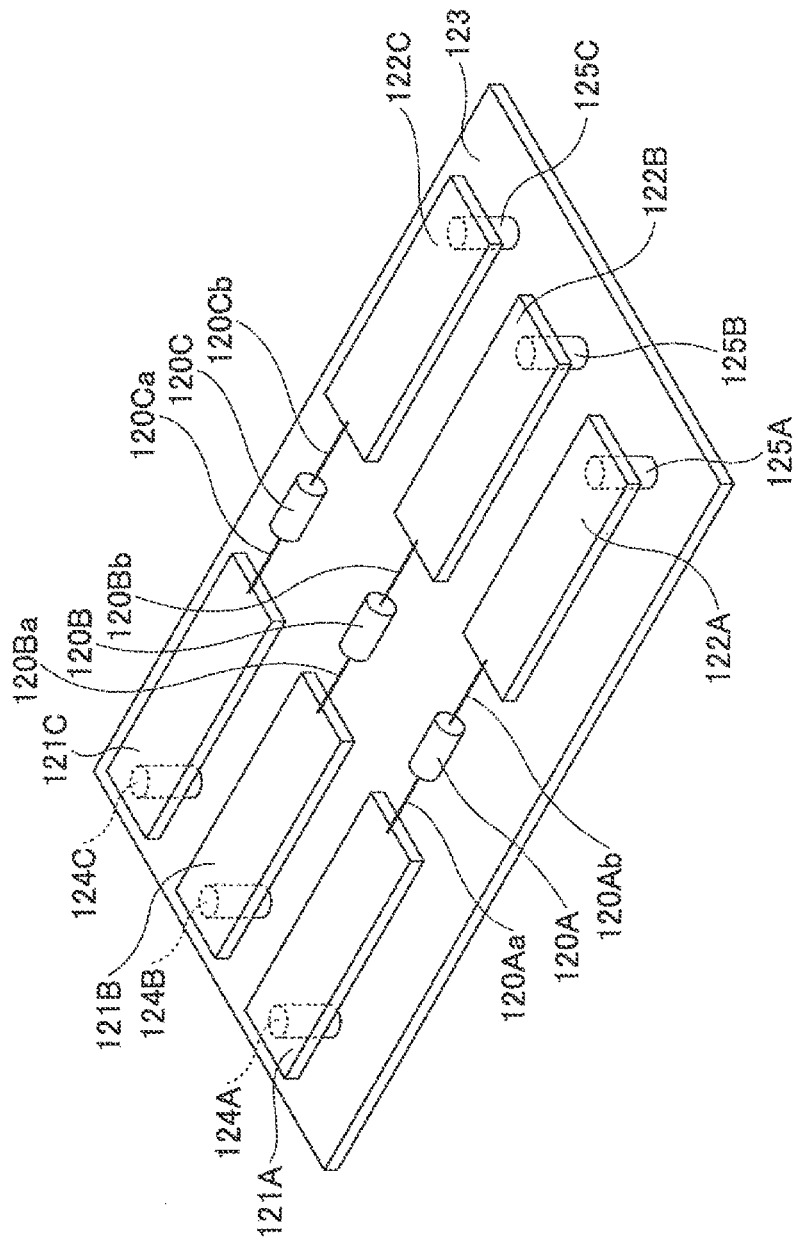

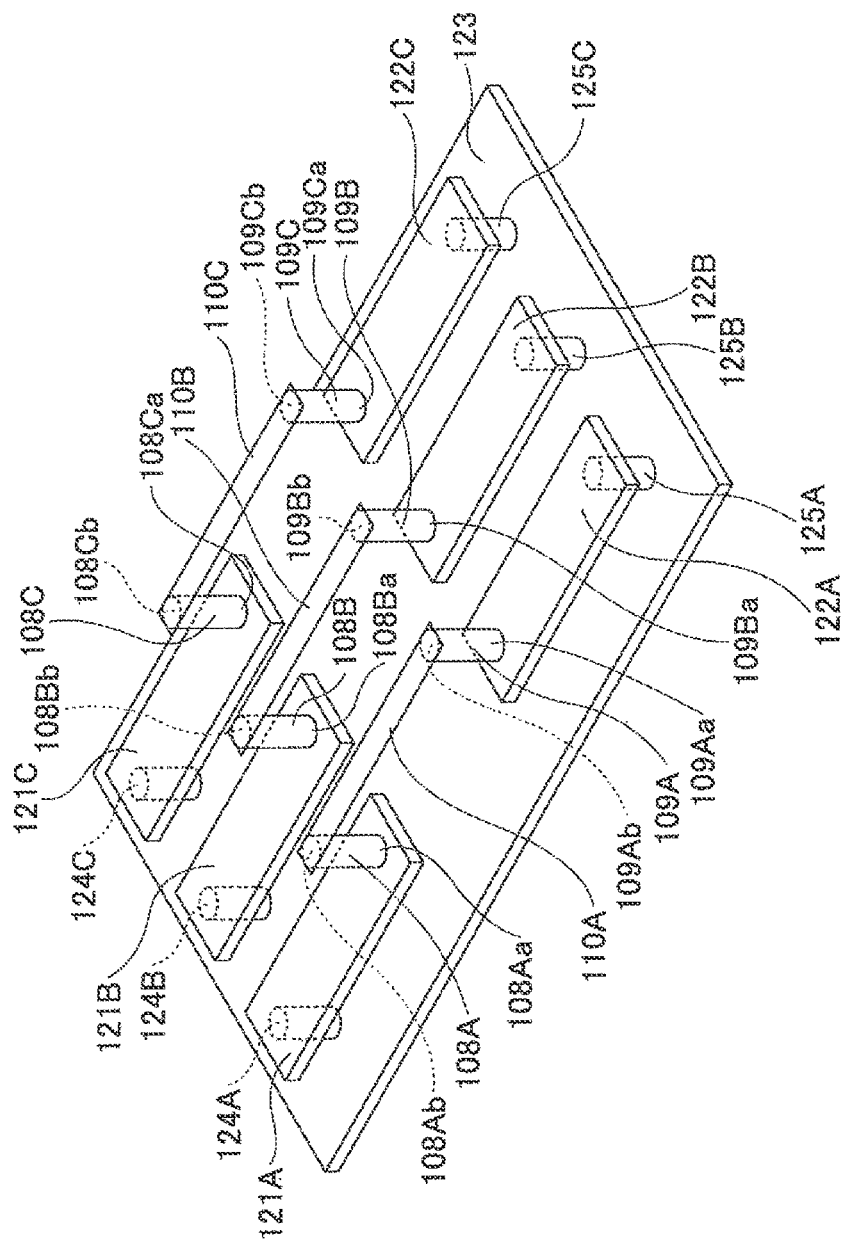

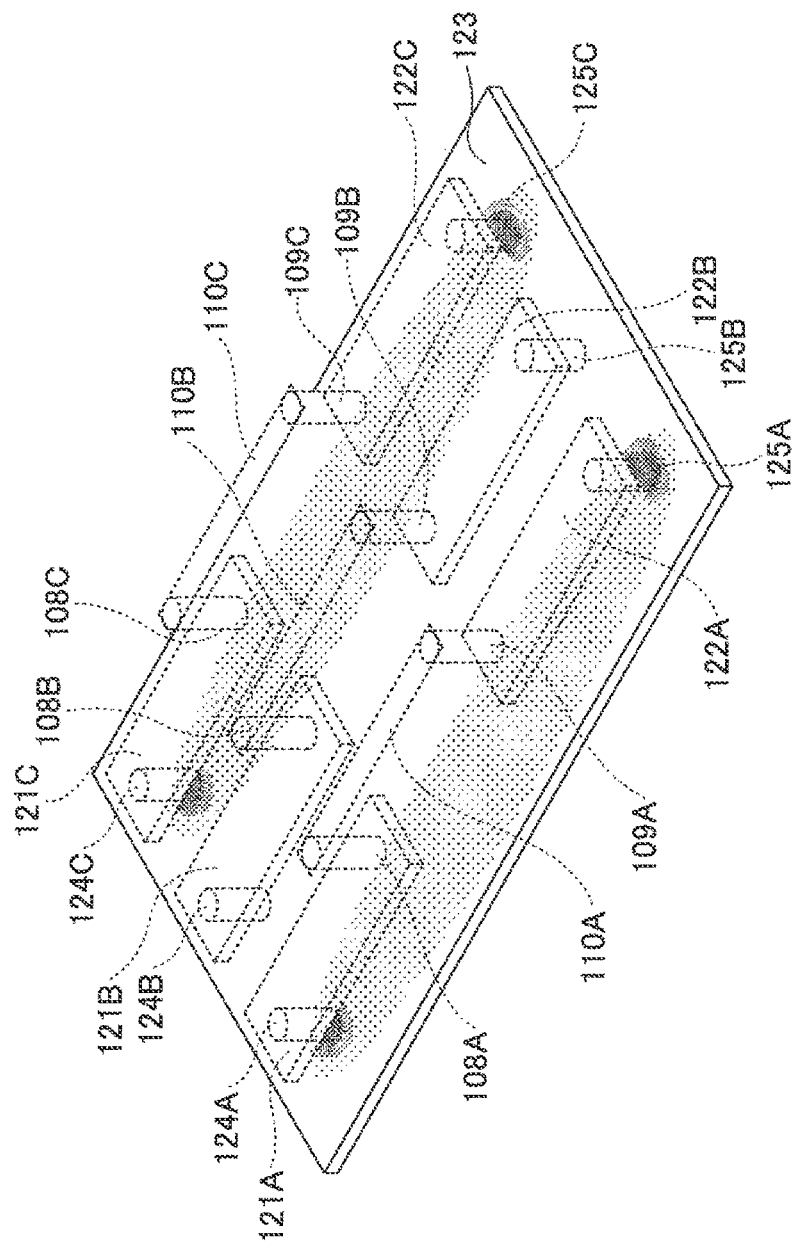

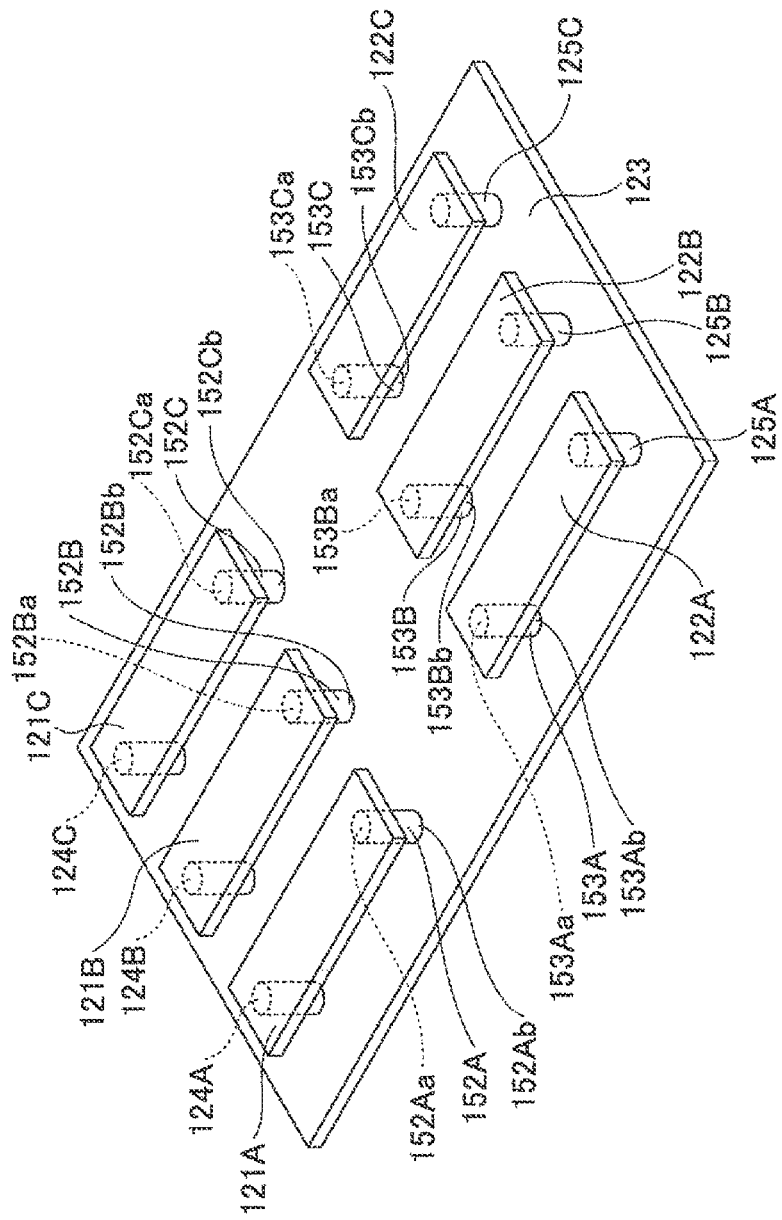

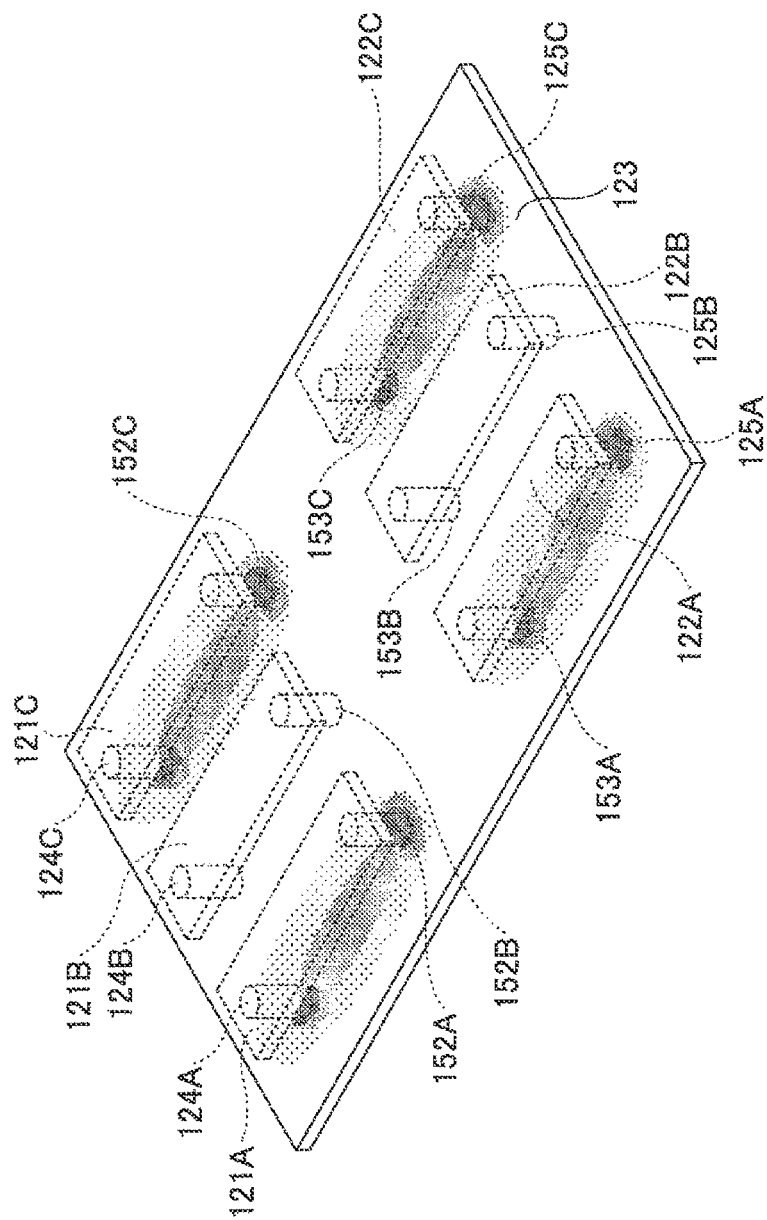

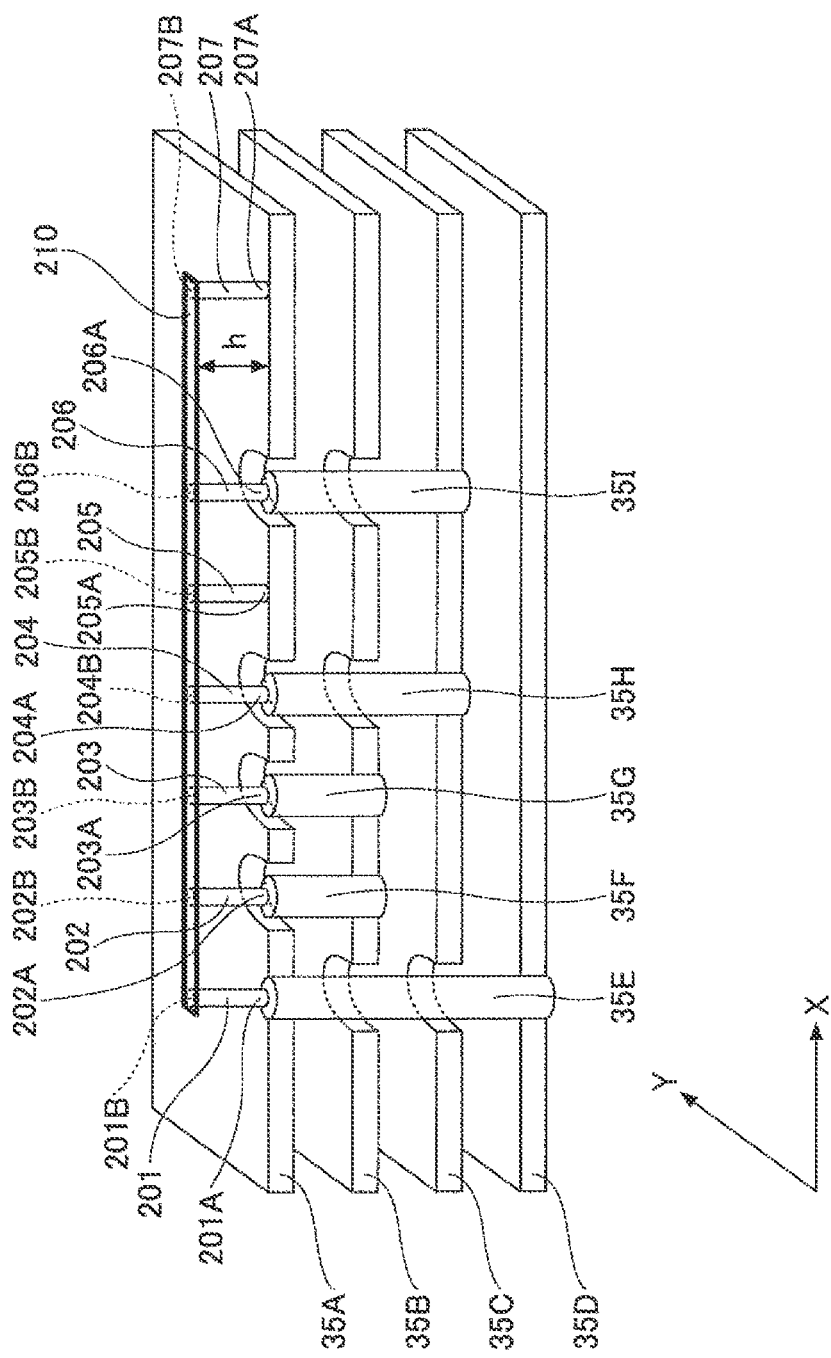

FIG.26

| COORDINATES OF VERTEX 1 (mm) | | COORDINATES OF VERTEX 2 (mm) | | COORDINATES OF VERTEX 3 (mm) | | COORDINATES OF VERTEX 4 (mm) | |
|---|---|---|---|---|---|---|---|
| X | Y | X | Y | X | Y | X | Y |
| x1 | y1 | x2 | y2 | x3 | y3 | x4 | y4 |

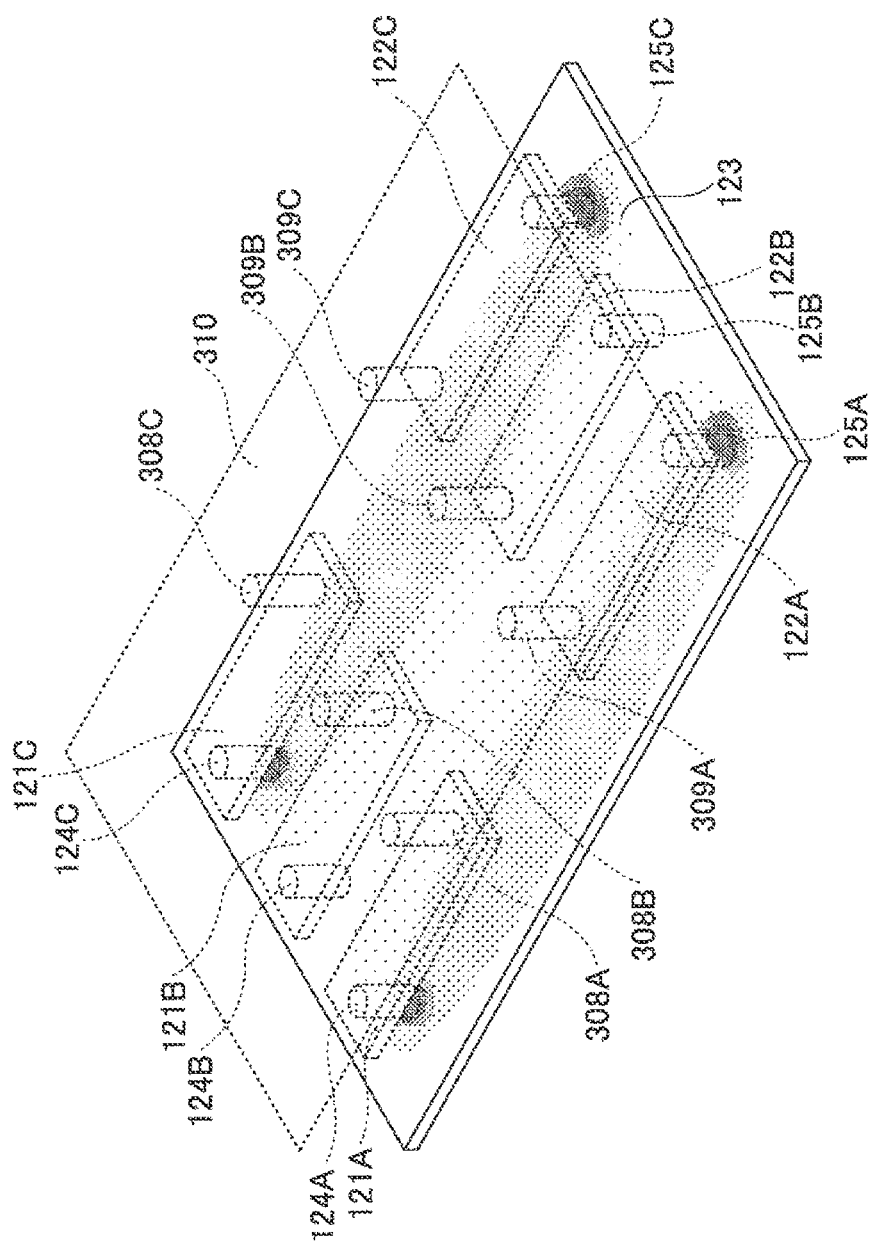

COUPLED ANALYSIS SIMULATION APPARATUS AND COUPLED ANALYSIS SIMULATION METHOD

CROSS-REFERENCE TO RELATED APPLICATIONS

This patent application is based upon and claims the benefit of priority of the prior Japanese Patent Application No. 2009-233251 filed on Oct. 7, 2009, the entire contents of which are incorporated herein by reference.

FIELD

The embodiments discussed herein are related to a coupled analysis simulation apparatus, a coupled analysis simulation method, and a computer-readable recording medium for performing electromagnetic field analysis and circuit analysis in coordination with each other.

BACKGROUND

Electromagnetic field analysis simulators are for performing EMC (Electro-Magnetic Compatibility) analysis on a PCB (Printed Circuit Board) on which electronic circuit modules are mounted. The EMC analysis is performed by various methods such as an FDTD (Finite-Difference Time-Domain) method, a moment method, and a TLM (Transmission-Line Matrix) method.

The FDTD method is for performing time-domain simulation on variations in the electromagnetic field of the analysis object. Specifically, the analysis object is divided into microscopic cells, and the electromagnetic fields of the cells are calculated at each analysis time step. The analysis time step in the FDTD method is dependent on the size of the cells. The maximum value of the analysis time step is limited by the size of the minimum cell, according to a stability condition for solutions of the simulation referred to as the Courant-Friedrichs-Lewy condition. The actual analysis time step in the FDTD method is typically set to be a microscopic value such as several tens of femtoseconds. Accordingly, an enormous number of calculations need to be performed to simulate temporal variations in the electromagnetic field between several nanoseconds and several tens of nanoseconds. For this reason, electromagnetic field analysis implemented with the FDTD method is typically performed by a parallel computation process with the use of plural processors, in order to reduce the calculation time.

Furthermore, the moment method is for obtaining variations in the electromagnetic field by deriving an integral equation of the analysis object with the use of a Maxwell equation and performing calculations in the frequency domain. Furthermore, the TLM method is for obtaining variations in the electromagnetic field of the analysis object in the time domain, similar to the FDTD method. Both in the moment method and the TLM method, an enormous number of calculations need to be performed in both the frequency domain and the time domain.

In recent years and continuing, various electronic circuit modules such as LSI (Large Scale Integration) are mounted on a printed circuit board. In order to improve the precision in EMC analysis of printed circuit boards, one approach is to perform electromagnetic field analysis by the FDTD method on the inside of the electronic circuit module such as LSI, in addition to performing the electromagnetic field analysis by the FDTD method on the substrate part including the wiring, the ground layer, and the power source layer. However, even more calculations need to be performed for the electromagnetic field analysis on the inside of electronic circuit module. Therefore, this approach is unrealistic for practical applications at present.

Accordingly, a coupled analysis simulation apparatus has been used for printed circuit boards on which electronic circuit modules such as LSI are mounted. Specifically, the coupled analysis simulation apparatus performs electromagnetic field analysis and circuit analysis in coordination with each other. The electromagnetic field analysis is performed by the FDTD method, etc., on elements other than electronic circuit modules such as wiring, the power source layer, and the ground layer. The circuit analysis is performed on electronic circuit modules such as LSI.

Signals are transmitted to the inside of the electronic circuit modules such as LSI, and to wiring on the substrate via terminals of the electronic circuit modules. The electromagnetic field in the wiring on the substrate is propagated to the inside of the electronic circuit modules via terminals of the electronic circuit modules.

In the conventional coupled analysis simulation apparatus, terminals of the electronic circuit modules are considered as virtual coupling devices for the coupled analysis, and the electronic circuit modules and the coupling devices are modeled. Accordingly, the coupled analysis is performed with the use of coupling devices that are virtual two-terminal devices that connect the analysis objects of the FDTD method to the analysis objects of the circuit analysis.

In a conventional coupling device, one terminal is connected to the wiring to which the electronic circuit module is connected, and the other terminal is connected to the nearest power source layer or ground layer to establish a current pathway.

In a conventional coupled analysis simulation apparatus, at each analysis time, a circuit analysis unit obtains the voltage value of the coupling device with the use of the current value of the coupling device, converts the obtained voltage value into an electric field value of the cell in which the coupling device is present, and passes the electric field value to an electromagnetic field analysis unit. Furthermore, the electromagnetic field analysis unit obtains the magnetic field from the electric field value of the cell in which the coupling device is present, converts the obtained magnetic field into a current value that flows into the coupling device, and passes the current value to the circuit analysis unit.

As described above, in the conventional technology, coupled analysis has been performed by repeating electromagnetic field analysis and circuit analysis while passing electric field values and current values of the coupling devices between the electromagnetic field analysis unit and the circuit analysis unit.

Patent document 1: Japanese Laid-Open Patent Application No. H11-153634

Patent document 2: Japanese Laid-Open Patent Application No. 2004-54642

Patent document 3: Japanese Laid-Open Patent Application No. 2008-217327

Patent document 4: International Publication 04/109560

Conventional coupled analysis simulation apparatuses have the following problems.

In a conventional coupling device, one terminal is connected to the wiring to which an electronic circuit module is connected, and the other terminal is connected to the nearest power source layer or ground layer. One of the terminals is connected to the nearest power source layer or ground layer for the purpose of establishing a current pathway at the part where the electronic circuit module is connected.

However, when coupling devices are connected between the wiring and the power source layer or ground layer, the current pathway may change from that of a case where the electronic circuit module is connected. Accordingly, a return path may not be accurately reproduced in the power source layer or ground layer.

Furthermore, when there are many connection parts (typically terminals) connecting the electronic circuit module to a conductive layer, it is difficult to recognize the current pathway inside the electronic circuit module. Thus, it is difficult to correctly determine where the coupling devices are to be connected, and therefore it may be difficult to model the coupling devices.

Even if the positions for connecting the coupling devices are correctly determined, the following problem may arise. That is, there may be cases where there are so many connection parts, such that the connection parts are blocked by other connection parts and the coupling devices may not be properly connected. When the coupling devices are not connected to the correct connection positions, it may not be possible to accurately reproduce the return path, even if the electromagnetic field analysis and the circuit analysis are performed in coordination with each other.

SUMMARY

According to an aspect of the invention, a coupled analysis simulation apparatus includes a coupled analysis processing unit configured to perform coupled analysis by performing electromagnetic field analysis and circuit analysis in coordination with each other, the electromagnetic field analysis being performed on a space including conductive layers to which an electronic circuit module is connected, the circuit analysis being performed on the electronic circuit module; a first generating unit configured to generate a virtual conductive part in a section or a region including connection parts connecting the electronic circuit module with the conductive layers; and a second generating unit configured to generate virtual connection parts that virtually connect the virtual conductive part with the conductive layers at positions where the connection parts are connected to the conductive layers.

According to an aspect of the invention, a coupled analysis simulation method is executed by a computer, the coupled analysis simulation method including performing coupled analysis by performing electromagnetic field analysis and circuit analysis in coordination with each other, the electromagnetic field analysis being performed on a space including conductive layers to which an electronic circuit module is connected, the circuit analysis being performed on the electronic circuit module; generating a virtual conductive part in a section or a region including connection parts connecting the electronic circuit module with the conductive layers; and generating virtual connection parts that virtually connect the virtual conductive part with the conductive layers at positions where the connection parts are connected to the conductive layers.

According to an aspect of the invention, a computer-readable recording medium records a coupled analysis simulation program that causes a computer to function as a coupled analysis processing unit configured to perform coupled analysis by performing electromagnetic field analysis and circuit analysis in coordination with each other, the electromagnetic field analysis being performed on a space including conductive layers to which an electronic circuit module is connected, the circuit analysis being performed on the electronic circuit module; a first generating unit configured to generate a virtual conductive part in a section or a region including connection parts connecting the electronic circuit module with the conductive layers; and a second generating unit configured to generate virtual connection parts that virtually connect the virtual conductive part with the conductive layers at positions where the connection parts are connected to the conductive layers.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 3A is a transparent perspective view and FIG. 3B illustrates a printed circuit board included in the electronic device;

FIGS. 4A through 4C illustrate examples of CAD data used in the coupled analysis simulation apparatus according to the first embodiment of the present invention;

FIG. 8A indicates virtual conductive part data used by the coupled analysis simulation apparatus according to the first embodiment of the present invention;

FIG. 8B indicates virtual coupling device data used by the coupled analysis simulation apparatus according to the first embodiment of the present invention;

FIG. 9 illustrates an example of a net list of the coupling device 100 used in the coupled analysis simulation apparatus according to the first embodiment of the present invention;

FIG. 11A indicates data including the coordinates, the dielectric constant, the electric conductivity, the magnetic permeability, the magnetic resistivity, and the density of each cell in an analysis model used for electromagnetic field analysis by the FDTD method;

FIG. 11B indicates data in which the identifier of the coupling device is associated with coordinates in the analysis model;

FIG. 13 is an example of data that is a table of association between electric field values, current values, and identifiers of the coupling devices used in the coupled analysis simulation apparatus according to the first embodiment of the present invention;

FIG. 15 indicates an example of data including electric field values and magnetic field values in cells in the analysis model used by the coupled analysis simulation apparatus according to the first embodiment of the present invention;

FIG. 16 indicates data expressing current values obtained for the cells by the analysis model used in the coupled analysis simulation apparatus according to the first embodiment of the present invention;

FIG. 19A is a perspective view of a part of a circuit in which electronic circuit modules are mounted;

FIG. 19B is a perspective view of the circuit of FIG. 19A, in which virtual conductive parts and coupling devices are disposed in the circuit;

FIG. 20 illustrates a return path reproduced on the circuit illustrated in FIG. 19B by the coupled analysis simulation apparatus according to the first embodiment of the present invention;

FIG. 22A is a perspective view of a circuit with coupling devices defined by a conventional coupled analysis simulation apparatus;

FIG. 22B illustrates a return path reproduced on the circuit illustrated in FIG. 22A by the conventional coupled analysis simulation apparatus;

FIG. 23 illustrates the connection of a virtual conductive part and coupling devices that are defined by a coupled analysis simulation apparatus according to a second embodiment of the present invention;

FIG. 26 illustrates an example of CAD data expressing the size of a printed circuit board used by the coupled analysis simulation apparatus according to the third embodiment of the present invention;

FIG. 29 illustrates a return path reproduced on the circuit illustrated in FIG. 28B by the coupled analysis simulation apparatus according to the third embodiment of the present invention.

DESCRIPTION OF EMBODIMENTS

A coupled analysis simulation apparatus, a coupled analysis simulation method, and a computer-readable recording medium according to embodiments of the present invention are explained with reference to accompanying drawings.
<First Embodiment>

Figure 1:
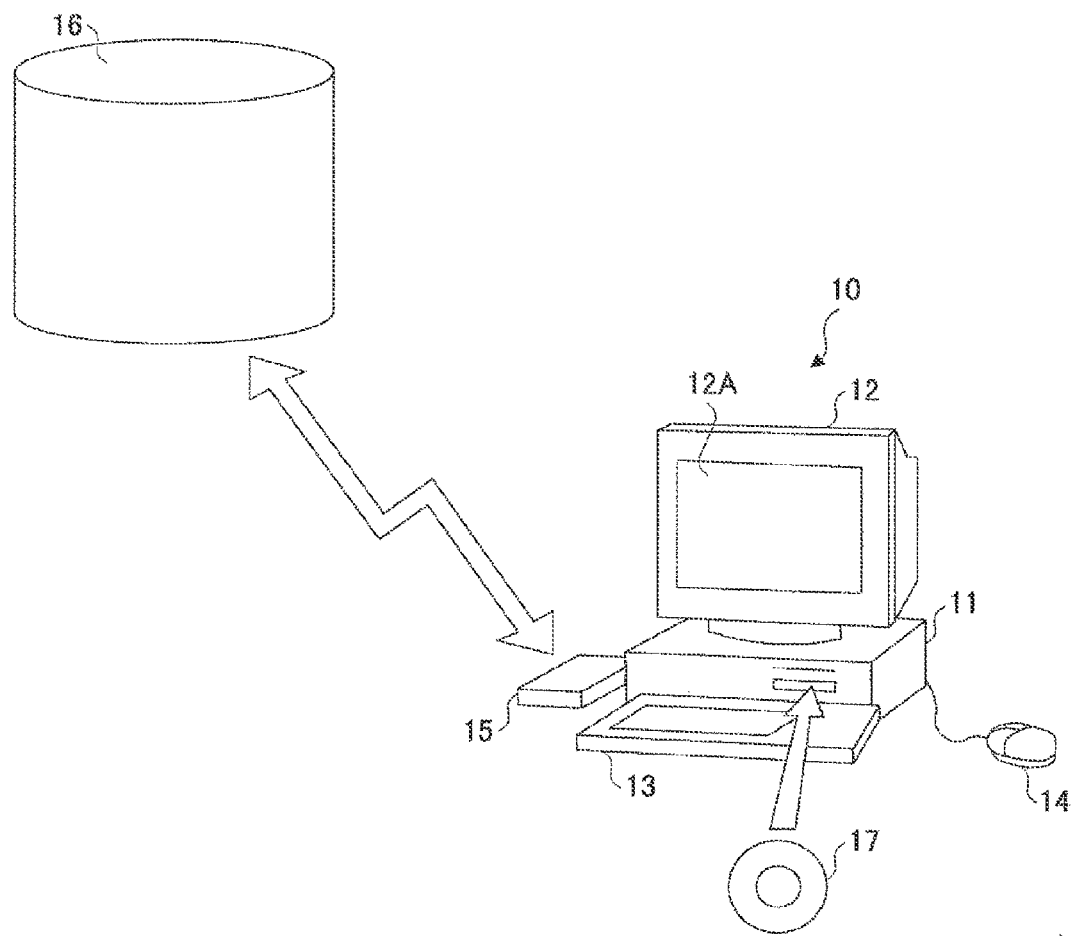
FIG. 1 is a perspective view of a computer system to which a coupled analysis simulation apparatus according a first embodiment of the present invention is applied.

FIG. 1 is a perspective view of a computer system to which a coupled analysis simulation apparatus according a first embodiment of the present invention is applied. A computer system 10 illustrated in FIG. 1 includes a main unit 11, a display 12, a keyboard 13, a mouse 14, and a modem 15.

The main unit 11 includes a CPU (Central Processing Unit), a HDD (Hard Disk Drive), and a disk drive. The display 12 is a display unit for displaying analysis results on a display screen 12A. For example, a liquid crystal monitor may be used as the display 12. The keyboard 13 is an input unit for inputting various kinds of information in the computer system 10. The mouse 14 is an input unit for specifying an arbitrary position on the display screen 12A of the display 12. The modem 15 accesses an external database to download programs that are stored in other computer systems.

A coupled analysis simulation program provides the computer system 10 with a coupled analysis function (electromagnetic field analysis and circuit analysis). The coupled analysis simulation program may be stored in a portable recording medium such as a disk 17, or may be downloaded from a recording medium 16 of another computer system with the use of a communications device such as the modem 15 and compiled in the computer system 10.

The coupled analysis simulation program causes the CPU of the computer system 10 to operate as a coupled analysis simulation apparatus having a coupled analysis function (electromagnetic field analysis and circuit analysis). The coupled analysis simulation program may be stored in a computer-readable recording medium such as the disk 17. The computer-readable recording medium is not limited to a portable recording medium such as the disk 17, an IC card memory, a magnetic disk such as a floppy disk (registered trademark), a magnet-optical disk, or a CD-ROM; the computer-readable recording medium includes various types of recording media that may be accessed by computer systems connected via communications devices such as the modem 15 or a LAN.

Figure 2:
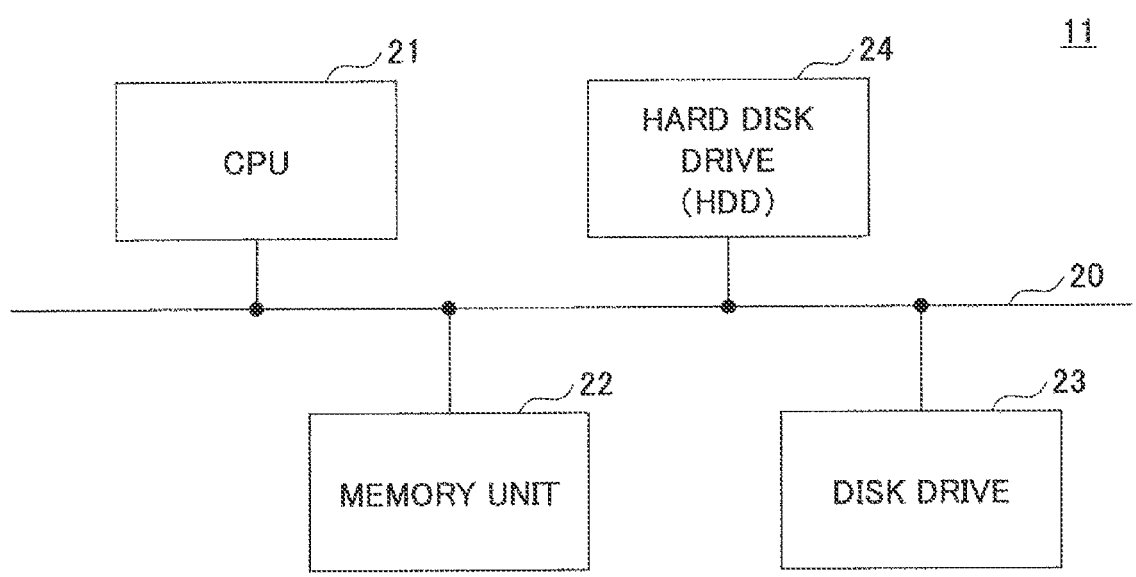
FIG. 2 is a block diagram of relevant parts of a main unit of the computer system 10.

FIG. 2 is a block diagram of relevant parts of the main unit 11 of the computer system 10. The main unit 11 includes a CPU 21, a memory unit 22 including a RAM or a ROM, a disk drive 23 for the disk 17, and a hard disk drive (HDD) 24, which are connected to each other by a bus 20.

The computer system 10 is not limited to that illustrated in FIGS. 1 and 2; the computer system 10 may additionally include various known elements, or the elements of the computer system 10 may be replaced by various known elements.

Figure 3A:
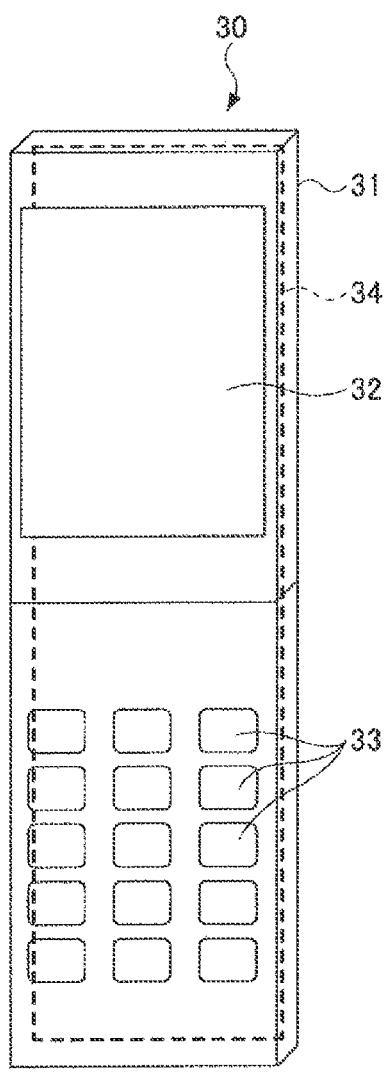
FIGS. 3A and 3B illustrate an electronic device on which calculations for coupled analysis (electromagnetic field analysis and circuit analysis) are performed by the coupled analysis simulation apparatus according to the first embodiment of the present invention, where
Figure 3B:
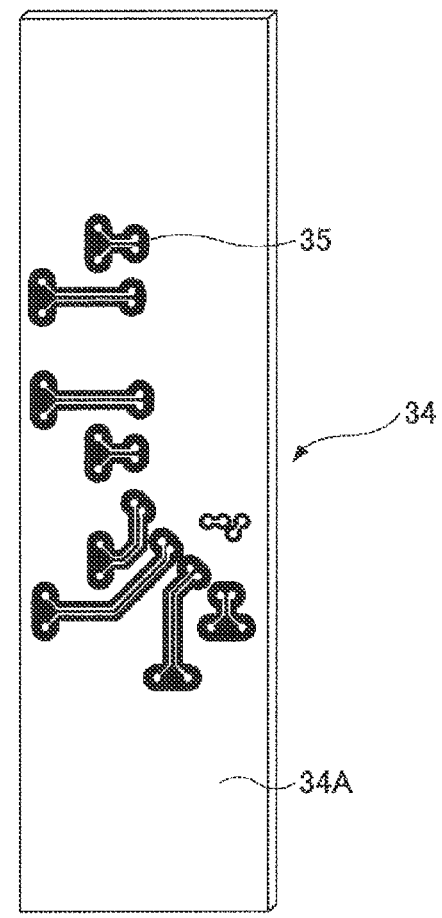

FIGS. 3A and 3B illustrate an electronic device on which calculations for coupled analysis (electromagnetic field analysis and circuit analysis) are performed by the coupled analysis simulation apparatus according to the first embodiment of the present invention. FIG. 3A is a transparent perspective view, and FIG. 3B illustrates a printed circuit board included in the electronic device. In the first embodiment, a mobile phone 30 is taken as an example of the electronic device.

As illustrated in FIG. 3A, a display unit 32 and an operations unit 33 are disposed on the outer surface of a case 31 of the mobile phone 30. A printed circuit board 34 indicated by dashed lines is accommodated inside the case 31.

The case 31 is made of resin or metal. The display unit 32 and the operations unit 33 are exposed through the case 31. The display unit 32 may be a liquid crystal panel for displaying, for example, characters, numbers, and images. The operations unit 33 includes number keys and various selection keys for selecting functions of the mobile phone 30. The mobile phone 30 may include accessory devices such as a proximity communications device (e.g., an infrared communications device and a communications device for using electronic money) or a camera.

The printed circuit board 34 illustrated in FIG. 3B includes a dielectric layer made of, for example, FR4 (glass cloth base material and epoxy resin) and a conductive layer 35. FIG. 3B illustrates the conductive layer 35 on a front surface 34A of the printed circuit board 34. Typically, plural dielectric layers are laminated on the printed circuit board 34. The conductive layers 35 that have undergone a patterning process are disposed between the dielectric layers in the laminated structure, on the topmost surface of the laminated structure, and on the bottommost surface of the laminated structure. The conductive layers 35 are used as wiring, power source layers, and ground layers for connecting electronic circuit modules such as LSI used for implementing functions of the mobile phone 30 relevant to telephone calls, e-mail, and the Internet. The conductive layers 35 may be made of, for example, copper foil, and are subjected to patterning by an etching process with the use of resist.

The printed circuit board 34 may be made of a material other than FR4, as long as the printed circuit board 34 includes a base material that is a dielectric body, on which the conductive layers 35 such as wiring may be formed and electronic circuit modules may be mounted.

The conductive layers 35 such as wiring may be made of a metal other than copper (CU), as long as the metal has small power loss and high electric conductivity (for example, aluminum (Al)).

CAD (Computer Aided Design) data relevant to the conductive layers 35, such as wiring formed on the printed circuit board 34, is stored in the HDD 24 illustrated in FIG. 2. Various kinds of data generated in the process of coupled analysis are stored in the HDD 24. The data is described below.

FIGS. 4A through 4C illustrate examples of CAD data used in the coupled analysis simulation apparatus according to the first embodiment of the present invention. FIGS. 4A through 4C illustrate CAD data of a printed circuit board having four conductive layers.

The CAD data indicated in FIG. 4A includes the identifier (No.) of the wiring, the layer number, the signal type, the data rate, the dielectric constant, the wiring width, the wiring height, starting point coordinates, and ending point coordinates. The starting points and ending points are expressed by using a coordinate system defined for the printed circuit board.

The CAD data indicated in FIG. 4B includes the layer number (No.) of the power source layer or ground layer, an indication (distinction) of the power source layer or ground layer (V/G), the dielectric constant, the height of the conductive layer, and the interval between layers.

The CAD data indicated in FIG. 4C is for indicating coordinates of terminals of electronic circuit modules mounted on the printed circuit board. The CAD data includes the identifier (No.) of the electronic circuit module, the layer number, the type of electronic circuit module, the height of the conductive layer, and X, Y coordinates of each terminal. The X, Y coordinates of each terminal of the electronic circuit module are managed by terminal numbers, and indicate coordinates on the front surface or the back surface of the printed circuit board.

The CAD data also includes information relevant to positions and sizes of via holes other than the information indicated in FIGS. 4A through 4C, although not illustrated. The values of identifiers, layer numbers, and dielectric constants indicated in FIGS. 4A through 4C are merely examples. In FIGS. 4A through 4C, alphanumeric symbols are used for expressing the values of the X, Y coordinates and heights; however, specific values are used when the coupled analysis is actually performed.

Next, a description is given of virtual conductive parts and coupling devices defined by the coupled analysis simulation apparatus according to the first embodiment of the present invention.

Figure 5A:
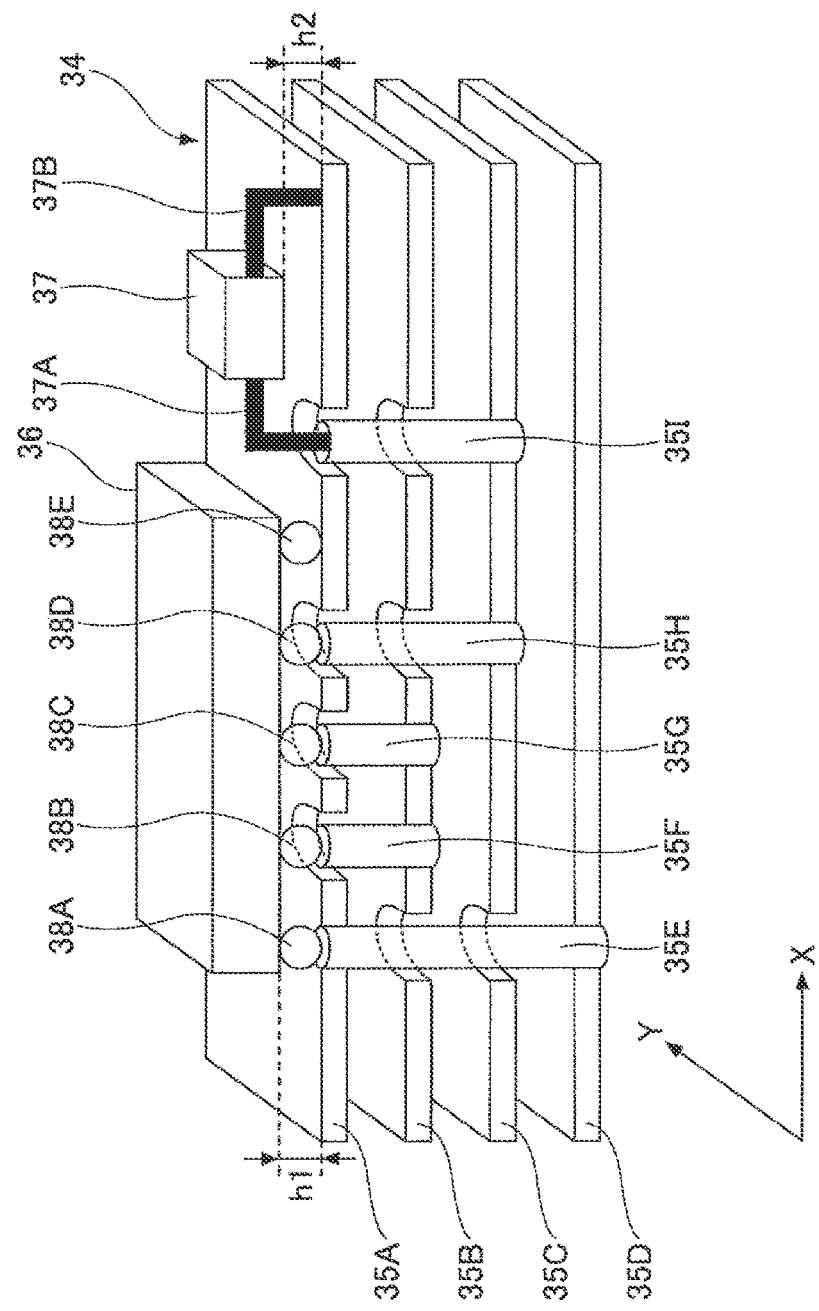
FIGS. 5A and 5B illustrate the relationship between the virtual conductive parts/coupling devices and the electronic circuit modules/terminals used by the coupled analysis simulation apparatus according to the first embodiment of the present invention.
Figure 5B:
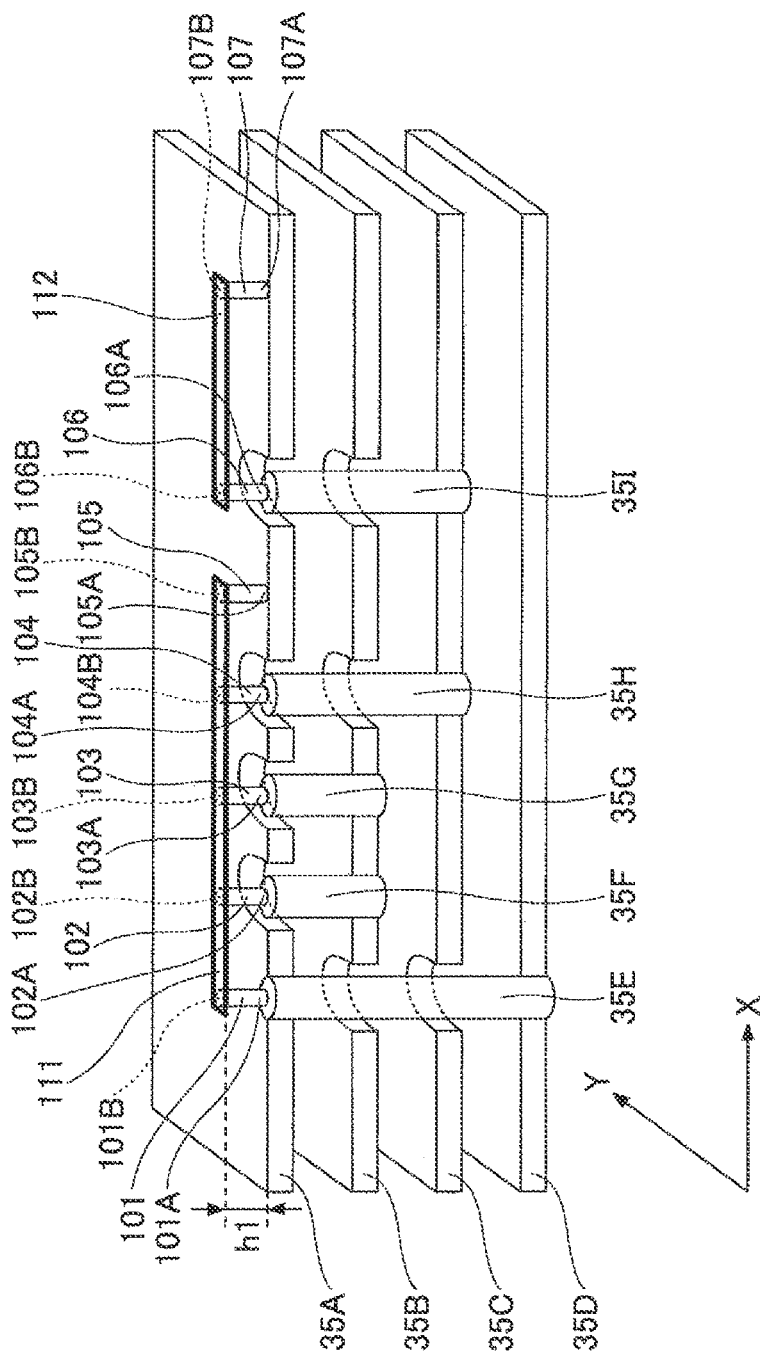

FIGS. 5A and 5B illustrate the relationship between the virtual conductive parts/coupling devices and the electronic circuit modules/terminals. FIG. 5A schematically illustrates the connection relationship between the electronic circuit modules and the conductive layers mounted on the printed circuit board. FIG. 5B illustrates virtual conductive parts and coupling devices generated by modeling the electronic circuit modules and the conductive layers illustrated in FIG. 5A.

The X, Y coordinate system of the CAD data indicated in FIGS. 4A and 4C is defined in the directions indicated in FIGS. 5A and 5B by using a corner of the printed circuit board 34 as the origin, for example. The height of the electronic circuit module is defined as the height in a perpendicular direction with respect to the X axis and the Y axis.

As illustrated in FIG. 5A, the printed circuit board 34 includes four conductive layers 35A through 35D. The conductive layers 35A through 35D are insulated from each other by three dielectric layers (not illustrated). The topmost conductive layer 35A and the bottommost conductive layer 35D are wiring layers, which are connected to signal sources, etc. (not illustrated). The second conductive layer 35B is a power source layer, which is connected to a power source (not illustrated) and maintained at a predetermined potential. The third conductive layer 35C is a ground layer, which is grounded.

An LSI (circuit) 36 and a bypass capacitor 37, which are embodiments of electronic circuit modules, are mounted on the printed circuit board 34. The LSI 36 is connected to the conductive layers 35A through 35D via bumps 38A through 38E, which are embodiments of connection parts connecting the electronic circuit module to the conductive layers. Specifically, the bump 38A is connected to the conductive layer 35A, and is also connected to the conductive layer 35D via a via hole 35E. The bumps 38B and 38C are connected to the conductive layer 35B via via holes 35F and 35G. The bump 38D is connected to the conductive layer 35C via a via hole 35H. The bump 38E is connected to the conductive layer 35A. The height between the LSI 36 and the topmost conductive layer 35A is h1 μm.

The bypass capacitor 37 includes a terminal 37A that is connected to the conductive layer 35C via a via hole 35I and a terminal 37B that is connected to the conductive layer 35A. The terminals 37A and 37B of the bypass capacitor 37 are embodiments of connection parts connecting the electronic circuit module to the conductive layers, similar to the bumps 38A through 38E. The height between the bypass capacitor 37 and the topmost conductive layer 35A is h2 μm.

Next, a description is given of coupling devices corresponding to the bumps 38A through 38E and the terminals 37A and 37B acting as connection parts, and the virtual conductive parts corresponding to the LSI 36 and the bypass capacitor 37, illustrated in FIG. 5A.

As illustrated in FIG. 5B, the coupled analysis simulation apparatus according to the first embodiment uses coupling devices 101 through 107 and virtual conductive parts 111 and 112. The bumps 38A through 38E and the terminals 37A and 37B acting as connection parts between the LSI 36 or the bypass capacitor 37 and the conductive layers 35A through 35D illustrated in FIG. 5A are modeled and defined as the coupling devices 101 through 107.

The coupling devices 101 through 107 are virtual connection parts. The coupling devices 101 through 107 include terminals 101A through 107A that are connected to the conductive layers (35A through 35D) before being modeled. The coupling devices 101 through 107 also include terminals 101B through 107B that are connected to the virtual conductive parts 111 and 112. In the coupled analysis simulation apparatus according to the first embodiment, the coupling devices 101 through 107, which are two-terminal devices that are embodiments of the virtual connection parts, are used for connecting the conductive layers 35A through 35D to the virtual conductive parts 111 and 112. The coupling devices 101 through 107 are defined as perfect conductors. In this example, perfect conductors have an electric resistance of zero.

The LSI 36 and the bypass capacitor 37 illustrated in FIG. 5A are modeled and defined as the virtual conductive parts 111 and 112, respectively. The virtual conductive parts 111 and 112 are defined as perfect conductors, which are located in a section or a region including the bumps 38A through 38E and the terminals 37A and 37B acting as connection parts.

In the first embodiment, the coupling devices 101 through 107 and the virtual conductive parts 111 and 112 are defined as perfect conductors; however, the coupling devices 101 through 107 and the virtual conductive parts 111 and 112 may be defined as conductors other than perfect conductors.

The virtual conductive part 111 is connected to the coupling devices 101 through 105 that are generated by modeling the bumps 38A through 38E (see FIG. 5A) that are arranged linearly, and therefore the virtual conductive part 111 is defined as a linear perfect conductor as a matter of convenience. Furthermore, the virtual conductive part 112 is connected to two coupling devices 106 and 107 that are generated by modeling the terminals 37A and 37B of the bypass capacitor 37 that is a simplified two-terminal device, and therefore the virtual conductive part 112 is defined as a linear perfect conductor as a matter of convenience.

However, the connection parts of an electronic circuit module are typically arranged in a planar manner (two-dimensionally). Therefore, in the process of generating a virtual conductive part described with reference to a flowchart of FIG. 7, a description is given of a process of generating a planar virtual conductive part.

In the following, the coupling devices 101 through 107 may be referred to as coupling devices 100, when the coupling devices 101 through 107 are not particularly distinguished from one another. Similarly, when the virtual conductive parts 111 and 112 are not particularly distinguished from one another, the virtual conductive parts 111 and 112 may be referred to as virtual conductive parts 110.

Next, a description is given of processing units included in the coupled analysis simulation apparatus according to the first embodiment. In the following description, it is assumed that a coupled analysis simulation program, which causes the computer system 10 illustrated in FIG. 1 to operate as the coupled analysis simulation apparatus having a coupled analysis simulation function (electromagnetic field analysis and circuit analysis), is stored in the HDD 24 illustrated in FIG. 2.

Figure 6:
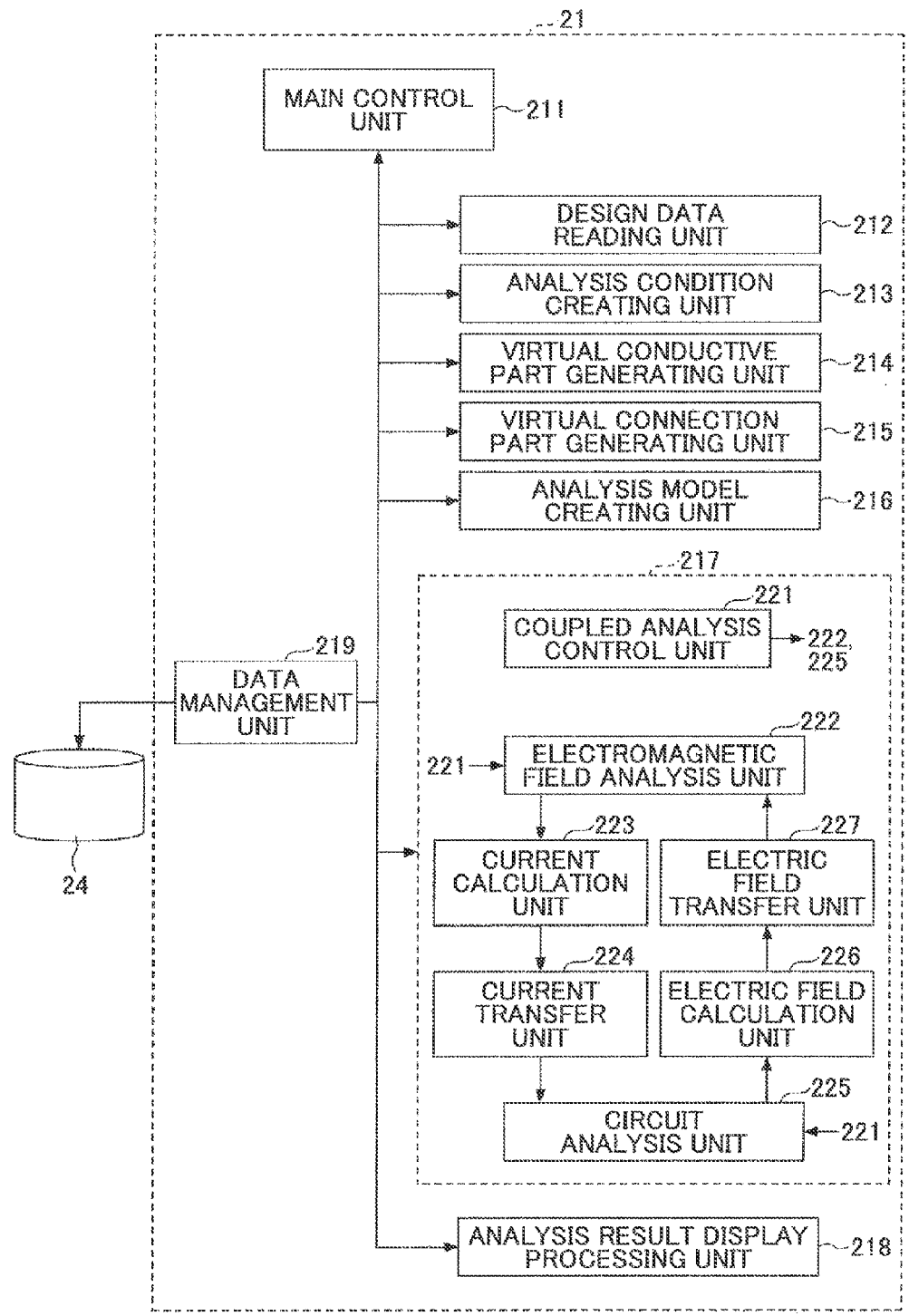
FIG. 6 is a block diagram of processing units included in the coupled analysis simulation apparatus according to the first embodiment of the present invention.

FIG. 6 is a block diagram of processing units included in the coupled analysis simulation apparatus according to the first embodiment of the present invention. The processing units illustrated in FIG. 6 are implemented as the CPU 21 illustrated in FIG. 2 executes the coupled analysis simulation program stored in the HDD 24.

The processing units that are implemented as the coupled analysis simulation program is executed include a main control unit 211, a design data reading unit 212, an analysis condition creating unit 213, a virtual conductive part generating unit 214, a virtual connection part generating unit 215, an analysis model creating unit 216, a coupled analysis processing unit 217, an analysis result display processing unit 218, and a data management unit 219. The coupled analysis processing unit 217 includes a coupled analysis control unit 221, an electromagnetic field analysis unit 222, a current calculation unit 223, a current transfer unit 224, a circuit analysis unit 225, an electric field calculation unit 226, and an electric field transfer unit 227.

The main control unit 211 controls the processing units of the design data reading unit 212 through the data management unit 219, and causes these processing units to execute processes.

The design data reading unit 212 reads the CAD data that is stored in the HDD 24.

The analysis condition creating unit 213 creates analysis conditions for creating an analysis model for electromagnetic field analysis, based on conditions input via the keyboard 13 and the mouse 14. The input conditions are, for example, X, Y, and Z coordinates indicating the region to be analyzed (hereinafter, "analysis region"), the number (division number) of cells into which the analysis region is divided in the X, Y, and Z axis directions, the time of the analysis (analysis time), the identifier of the electronic circuit module that is the analysis object, the terminal number of the terminal of the electronic circuit module, and physical properties of the printed circuit board 34. Physical properties of the printed circuit board 34 include, for example, the dielectric constant, the electric conductivity, the magnetic permeability, and the density.

The virtual conductive part generating unit 214 generates the virtual conductive part 110 by modeling the electronic circuit module. Details of the generating method are described with reference to the flowchart of FIG. 7.

The virtual connection part generating unit 215 generates the coupling device 100 that is an embodiment of the virtual connection part connecting the virtual conductive part 110, which is generated by the virtual conductive part generating unit 214, to the conductive layers 35. Details of the generating method are described with reference to the flowchart of FIG. 7.

The analysis model creating unit 216 creates an analysis model for electromagnetic field analysis by discretizing the three-dimensional space including the printed circuit board 34, the conductive layers 35, and the virtual conductive part 110, based on data indicating the analysis region and the division number among the analysis conditions created by the analysis condition creating unit 213.

The analysis model is a spatial model formed by dividing parts of the printed circuit board 34, the conductive layers 35, and the virtual conductive parts 110 included in the analysis region (three-dimensional space), by the division number in the X, Y, and Z axis directions, so that cells are formed as a result of the division.

In the coupled analysis simulation apparatus according to the first embodiment, the electromagnetic field analysis is performed upon defining the virtual conductive parts 110 and the coupling devices 100 in the region where the electronic circuit modules and terminals are present. Accordingly, the analysis model includes the virtual conductive parts 110 and the coupling devices 100 corresponding to the electronic circuit modules and terminals that are the analysis objects. A description is given of the analysis model with reference to FIG. 10.

The coupled analysis processing unit 217 includes the coupled analysis control unit 221, the electromagnetic field analysis unit 222, the current calculation unit 223, the current transfer unit 224, the circuit analysis unit 225, the electric field calculation unit 226, and the electric field transfer unit 227; and performs coupled analysis in which electromagnetic field analysis and circuit analysis are performed in coordination with each other. Details of coupled analysis are described with reference to FIGS. 12 through 14.

The analysis result display processing unit 218 causes the display screen 12A of the display 12 illustrated in FIG. 1 to display analysis results obtained by the coupled analysis performed by the electromagnetic field analysis unit 222 and the circuit analysis unit 225. An example of analysis results is a return path obtained by coupled analysis. A description is given of a return path with reference to FIGS. 18 and 20.

The data management unit 219 is for managing the operations of storing data in the HDD 24.

Figure 7:
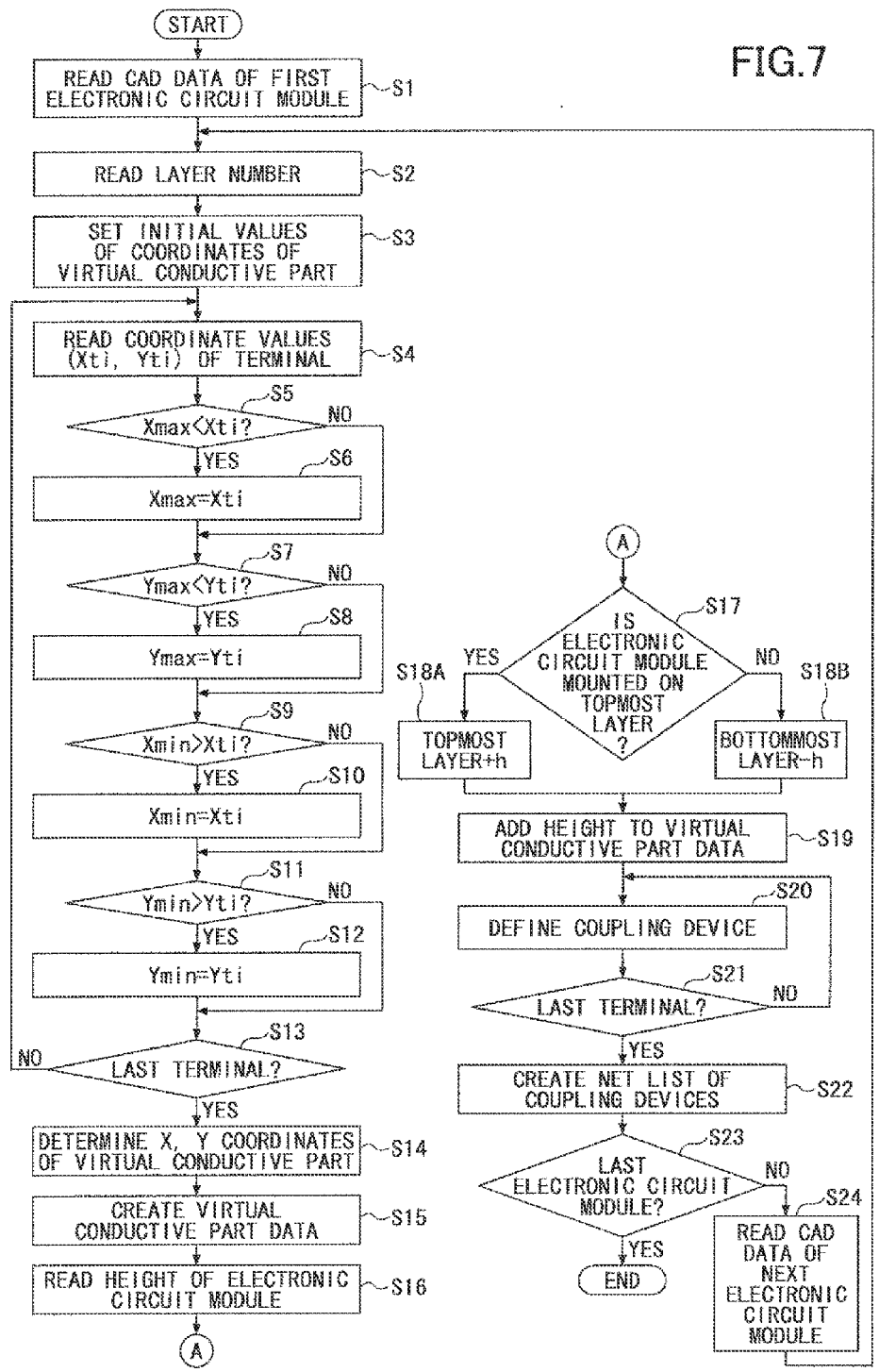
FIG. 7 is a flowchart of a process for generating virtual conductive parts and coupling devices performed by the coupled analysis simulation apparatus according to the first embodiment of the present invention.

FIG. 7 is a flowchart of a process for generating virtual conductive parts and coupling devices performed by the coupled analysis simulation apparatus according to the first embodiment of the present invention. The process illustrated in FIG. 7 is what the main control unit 211 inside the CPU 21 causes the virtual conductive part generating unit 214 and the virtual connection part generating unit 215 to execute. This process is executed according to analysis conditions created by the analysis condition creating unit 213.

The process illustrated in FIG. 7 is applied to a case of generating the planar virtual conductive part 110 that is specified by four vertices. Coordinates of the four vertices are (Xmin, Ymin), (Xmin, Ymax), (Xmax, Ymin), and (Xmax, Ymax).

When the main control unit 211 starts the flow of the process, the virtual conductive part generating unit 214 reads the CAD data (see FIG. 4C) corresponding to the electronic circuit module having the lowest identifier number among the electronic circuit modules included in the analysis conditions (step S1).

Next, the virtual conductive part generating unit 214 reads the layer number of the conductive layer 35 on which the electronic circuit module (CAD data) read in step S1 is mounted (step S2). For example, when the electronic circuit module of the corresponding identifier (No.) in the CAD data indicated in FIG. 4C has a layer number of 1, the virtual conductive part generating unit 214 recognizes that this electronic circuit module is mounted on the topmost layer. When the electronic circuit module of the corresponding identifier (No.) in the CAD data indicated in FIG. 4C has a layer number of 4, the virtual conductive part generating unit 214 recognizes that this electronic circuit module is mounted on the bottommost layer. When the electronic circuit module specified in the analysis conditions has an identifier of 1, and this identifier corresponds to the identifier of the LSI 36 illustrated in FIG. 5B, the layer number of the LSI 36 is read, so that the virtual conductive part generating unit 214 recognizes whether the LSI 36 is mounted on the conductive layer 35A that is the topmost layer or the conductive layer 35D that is the bottommost layer.

The virtual conductive part generating unit 214 specifies the X, Y coordinates of the terminal having the smallest terminal number among the terminals indicated in the analysis conditions, as the initial X, Y coordinates expressing the position of the virtual conductive part 110 (step S3).

The initial values of the coordinates are specified as follows. Specifically, Xmin and Xmax are specified as the X coordinates of the terminal having the smallest terminal number, and Ymin and Ymax are specified as the Y coordinates of the terminal having the smallest terminal number. For example, when the electronic circuit module having an identifier (No.) 1 indicated in FIG. 4C is specified in the analysis conditions, the coordinates (Xt1, Yt1) of terminal 1 are read, and the initial values of the coordinates are specified as Xmin=Xmax=Xt1, Ymin=Ymax=Yt1.

The virtual conductive part generating unit 214 reads, from the CAD data, the coordinates (Xti, Yti) of the terminal having the next smallest terminal number (step S4). For example, when the virtual conductive part generating unit 214 has read, in step S3, the coordinates (Xt1, Yt1) of terminal 1 of the electronic circuit module having an identifier (No.) 1 indicated in FIG. 4C, in step S4, the virtual conductive part generating unit 214 reads coordinates (Xt2, Yt2) of terminal 2.

Next, the virtual conductive part generating unit 214 determines whether Xmax<Xti is satisfied with respect to the X coordinate (Xti) of the coordinates (Xti, Yti) of the terminal read in step S4 (step S5).

When the virtual conductive part generating unit 214 determines that Xmax<Xti is satisfied in step S5 (Yes in step S5), the virtual conductive part generating unit 214 sets Xti as Xmax (step S6). Accordingly, the value of Xmax is set to an even larger value Xti.

When the virtual conductive part generating unit 214 determines that Xmax<Xti is not satisfied in step S5 (No in step S5), or when the process of step S6 has ended, the virtual conductive part generating unit 214 determines whether Ymax<Yti is satisfied with respect to the Y coordinate (Yti) of the coordinates (Xti, Yti) (step S7).

When the virtual conductive part generating unit 214 determines that Ymax<Yti is satisfied in step S7 (Yes in step S7), the virtual conductive part generating unit 214 sets Yti as Ymax (step S8). Accordingly, the value of Ymax is set to an even larger value Yti.

When the virtual conductive part generating unit 214 determines that Ymax<Yti is not satisfied in step S7 (No in step S7), or when the process of step S8 has ended, the virtual conductive part generating unit 214 determines whether Xmin>Xti is satisfied with respect to the X coordinate (Xti) of the coordinates (Xti, Yti) (step S9).

When the virtual conductive part generating unit 214 determines that Xmin>Xti is satisfied in step S9 (Yes in step S9), the virtual conductive part generating unit 214 sets Xti as Xmin (step S10). Accordingly, the value of Xmin is updated to an even smaller value Xti.

When the virtual conductive part generating unit 214 determines that Xmin>Xti is not satisfied in step S9 (No in step S9), or when the process of step S10 has ended, the virtual conductive part generating unit 214 determines whether Ymin>Yti is satisfied with respect to the Y coordinate (Yti) of the coordinates (Xti, Yti) (step S11).

When the virtual conductive part generating unit 214 determines that Ymin>Yti is satisfied in step S11 (Yes in step S11), the virtual conductive part generating unit 214 sets Yti as Ymin (step S12). Accordingly, the value of Ymin is updated to an even smaller value Yti.

Next, the virtual conductive part generating unit 214 determines whether the currently processed terminal is the last terminal (step S13). The process of step S13 is for determining whether steps S4 through S12 have been completed for all of the terminals specified in the analysis conditions. The virtual conductive part generating unit 214 determines whether the currently processed terminal is the last terminal based on the terminal number of the terminal of the electronic circuit module included in the analysis results.

When the virtual conductive part generating unit 214 determines, in step S13, that the currently processed terminal is not the last terminal (No in step S13), the flow returns to step S4. Thereafter, steps S4 through S13 are repeated, so that the coordinate values of Xmax, Xmin, Ymax, and Ymin are updated for all terminals included in the analysis conditions. Accordingly, all of the terminals specified for the electronic circuit module selected in step S1 are included in the virtual conductive part 110, which is expressed by the four vertices (Xmin, Ymin), (Xmin, Ymax), (Xmax, Ymin), and (Xmax, Ymax), within the XY plane.

For example, when the LSI 36 illustrated in FIG. 5A is selected in step S4, and the bumps 38A through 38E are specified as the terminals of the LSI 36 in the analysis conditions, the four vertices of the virtual conductive part 111 illustrated in FIG. 5B are determined. Definitions of the coupling devices 101 through 105 illustrated in FIG. 5B are described together with the process of step S20.

When the virtual conductive part generating unit 214 determines, in step S13, that the currently processed terminal is the last terminal (Yes in step S13), the virtual conductive part generating unit 214 determines the values of Xmax, Xmin, Ymax, and Ymin (step S14). Accordingly, the four vertices of the virtual conductive part 110 are determined as (Xmin, Ymin), (Xmin, Ymax), (Xmax, Ymin), and (Xmax, Ymax).

The virtual conductive part generating unit 214 creates virtual conductive part data, by associating the coordinates of the four vertices determined in step S14 with the identifier of the virtual conductive part 110 (step S15). The virtual conductive part data is obtained by associating the identifier, the X, Y coordinate values of the four vertices, the layer number, and the height of the virtual conductive part 110. Among these, the data expressing the layer number and height are added in step S19 described below. The data structure of the virtual conductive part data is described with reference to FIG. 8A.

Next, the virtual conductive part generating unit 214 reads the height (h) of the electronic circuit module from the CAD data (step S16). This step is performed to set the height between the virtual conductive part 110 and the front surface (or back surface) of the printed circuit board 34 to be the same as the height of the electronic circuit module. The data expressing the height of the electronic circuit module is included in the CAD data indicated in FIG. 4C.

The virtual conductive part generating unit 214 determines whether the electronic circuit module is mounted on the topmost layer (step S17). This step is performed because the direction of the height of the electronic circuit module differs depending on whether the electronic circuit module is mounted on the topmost layer or the bottommost layer. The determination of step S17 is made based on the layer number read in step S2.

When the virtual conductive part generating unit 214 determines that the electronic circuit module is mounted on the topmost layer (Yes in step S17), a value, which is obtained by adding the height (h) obtained in step S16 to the height of the topmost conductive layer 35 (height of topmost layer +h), is set as the height of the virtual conductive part 110 (step S18A).

When the virtual conductive part generating unit 214 determines that the electronic circuit module is mounted on the bottommost layer (No in step S17), a value, which is obtained by subtracting the height (h) obtained in step S16 from the height of the bottommost conductive layer 35 (height of bottommost layer −h), is set as the height of the virtual conductive part 110 (step S18B).

Next, the virtual conductive part generating unit 214 adds, to the virtual conductive part data, the layer number recognized in step S17 and the height of the virtual conductive part 110 obtained in step S18A or S18B (step S19). When the height of the virtual conductive part 110 obtained in step S18A is (height of topmost layer +h), +h is added as the data expressing the height. Meanwhile, when the height of the virtual conductive part 110 obtained in step S18B is (height of bottommost layer −h), −h is added as the data expressing the height. The layer number is added as data for expressing the layer on which the electronic circuit module is mounted.

Next, the virtual connection part generating unit 215 defines the coupling device 100 (step S20). In the coupled analysis simulation apparatus according to the first embodiment of the present invention, each coupling device 100 is defined to be at a position of one of the terminals included in the analysis conditions. The coupling device 100 is a two-terminal device that virtually connects the conductive layers 35 to the virtual conductive part 110. Thus, the positions of both terminals of the coupling device 100, which is a two-terminal device, are identified. This identification is done by associating the X, Y coordinates of the terminal included in the analysis conditions among the terminals included in the CAD data indicated in FIG. 4C, with the layer number and height of the virtual conductive part 110 registered in step S19. In the coupled analysis simulation apparatus according to the first embodiment of the present invention, the coupling device 100 is defined by associating the identifier of the coupling device 100, the X, Y coordinates, the layer number, and the height.

Specifically, the virtual connection part generating unit 215 sequentially reads the X, Y, coordinates of the terminals included in the analysis conditions one by one, starting from the smallest terminal number. In step S20, the virtual connection part generating unit 215 associates the X, Y coordinates of the corresponding terminal with the layer number and the height of the virtual conductive part 110 registered in step S19, and gives an identifier to the coupling device 100.

The height of the coupling device 100 is expressed by +h or −h; +h is the height between the coupling device 100 and the topmost conductive layer 35, and −h is the height between the coupling device 100 and the bottommost conductive layer 35. The layer number expresses whether the position where the coupling device 100 is defined is on the topmost layer or the bottommost layer.

The virtual connection part generating unit 215 determines whether the terminal defining the coupling device 100 processed in step S20 is the last terminal (step S21). The terminals included in the analysis conditions are selected one by one to define each coupling device, and the selected terminal is processed in step S20. Therefore, step S20 is repeatedly performed until it is determined in step S21 that the processed terminal is the last terminal.

As the processes of steps S20 and S21 are repeated, coupling device data is created for each coupling device 100. In the coupling device data, the identifier, the X, Y coordinates, and the height of the corresponding coupling device 100 are associated with each other. The coupling device data is described with reference to FIG. 8B.

Next, the virtual connection part generating unit 215 creates a net list of the coupling devices 100 (step S22). In the net list, the identifier of the coupling device 100 is described. The net list of the coupling device 100 is described with reference to FIG. 9.

The virtual conductive part generating unit 214 determines whether the processed electronic circuit module is the last electronic circuit module included in the analysis conditions (step S23).

When the virtual conductive part generating unit 214 determines that the processed electronic circuit module is not the last electronic circuit module, the virtual conductive part generating unit 214 reads the CAD data of the next electronic circuit module included in the analysis conditions (step S24).

When the process of step S24 ends, the virtual conductive part generating unit 214 returns to step S2. Then, steps S2 through S24 are repeated.

Meanwhile, when the virtual conductive part generating unit 214 determines that the processed electronic circuit module is the last electronic circuit module (Yes in step S23), the virtual conductive part generating unit 214 ends the series of steps for defining the virtual conductive parts 110 and the coupling devices 100.

According to the above process, the virtual conductive parts 110 corresponding to the electronic circuit modules included in the analysis conditions and the coupling devices 100 corresponding to the terminals of the electronic circuit modules are virtually generated.

FIG. 7 illustrates the process of generating the virtual conductive parts 110 and the coupling devices 100, including determining the X, Y coordinates of the virtual conductive part 110 by executing steps S3 through S14, determining the height of each of the virtual conductive parts 110 by executing step S18A or S18B, and then defining the coupling devices 100.

However, the process of generating the virtual conductive parts 110 and the coupling devices 100 performed by the coupled analysis simulation apparatus according to the first embodiment of the present invention is not limited to the order of the process as illustrated in FIG. 7. For example, the coupling devices 100 may be defined before defining the virtual conductive parts 110. Specifically, by repeating steps S20 and S21, the positions of the terminals included in the analysis conditions are recognized as positions where the coupling devices 100 are to be generated, and the coupling devices 100 are defined first by associating the heights of the electronic circuit modules with the recognized positions. Next, by executing steps S3 through S14, the virtual conductive parts 110 to be connected to the coupling devices 100 are defined.

FIG. 8A indicates the virtual conductive part data used in the coupled analysis simulation apparatus according to the first embodiment of the present invention. FIG. 8B indicates the coupling device data used in the coupled analysis simulation apparatus according to the first embodiment of the present invention.

The virtual conductive part data indicated in FIG. 8A is created as the virtual conductive part generating unit 214 executes the process illustrated in FIG. 7. The virtual conductive part data indicated in FIG. 8A includes the identifier (No.), the X, Y coordinates of the vertices, the layer number, and the height of each virtual conductive part 110. The X, Y coordinates of the vertices are written in at step S14 of FIG. 7, and the layer number and height are written in at step S18A or S18B. As described above, the layer number expresses whether the virtual conductive part 110 is to be defined on the topmost layer or the bottommost layer, and the height is expressed as +h or −h, where +h expresses the height from the topmost conductive layer 35 and −h expresses the height from the bottommost conductive layer 35.

The coupling device data indicated in FIG. 8B is created as the virtual connection part generating unit 215 executes the process illustrated in FIG. 7. The coupling device data indicated in FIG. 8B includes the identifier (No.), the X, Y coordinates, the layer number, and the height of each coupling device 100. The X, Y coordinates, the layer number, and the height are written in at steps S15 through S19 of FIG. 7. As described above, the height is expressed as +h or −h, +h expresses the height from the topmost conductive layer 35, and −h expresses the height from the bottommost conductive layer 35.

In FIGS. 8A and 8B, alphanumeric symbols are used for expressing the values of the X, Y coordinates and heights; however, specific values are used when the coupled analysis is actually performed.

FIG. 9 illustrates an example of a net list of the coupling device 100 used in the coupled analysis simulation apparatus according to the first embodiment of the present invention. The net list of the coupling device 100 is created by the virtual connection part generating unit 215 in step S22 of FIG. 7. The net list of FIG. 9 expresses that the coupling device 100 expressed by the code a1 is connected between t1-0, and that the identifier (id) of the coupling device 100 is n. In this example, t1 expresses the terminal of the coupling device 100 connected to the conductive layer 35, and 0 expresses that the other terminal of the coupling device 100 is connected to the virtual conductive part 110 that is a perfect conductor.

Figure 10:
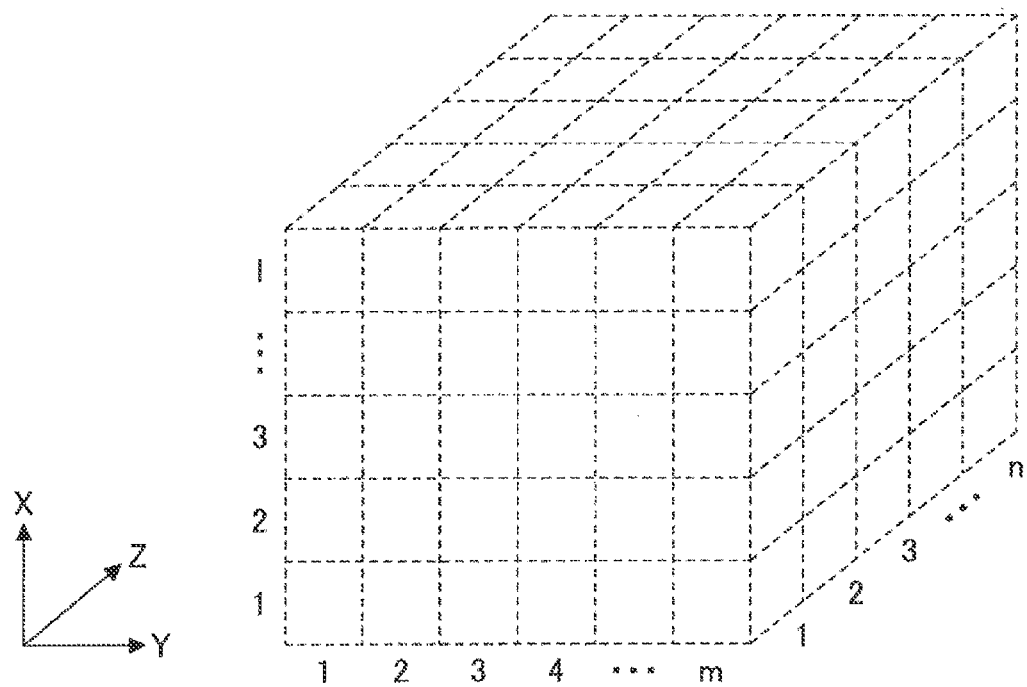
FIG. 10 illustrates an example of an analysis model used in the coupled analysis simulation apparatus according to the first embodiment of the present invention.

FIG. 10 illustrates an example of an analysis model used in the coupled analysis simulation apparatus according to the first embodiment of the present invention. As illustrated in FIG. 10, the analysis model is divided into l (lower-case of L) cells in the X axis direction (l being an arbitrary integer of 2 or more), m cells in the Y axis direction (m being an arbitrary integer of 2 or more), and n cells in the Z axis direction (n being an arbitrary integer of 2 or more). Thus, the analysis model is three-dimensionally discretized into cells. The coordinates of the cells are not the coordinates of the printed circuit board 34; the coordinates of the cells are (X, Y, Z) coordinates in the analysis model. Such an analysis model is created for a three-dimensional space including the printed circuit board 34, the conductive layers 35, the coupling devices 100, and the virtual conductive parts 110.

FIG. 11A indicates data including the coordinates, the dielectric constant, the electric conductivity, the magnetic permeability, the magnetic resistivity, and the density of each cell in an analysis model used for electromagnetic field analysis by the FDTD method. The coordinates (X, Y, Z) of each cell correspond to coordinates in the analysis model.

FIG. 11B indicates data in which the identifier of the coupling device is associated with coordinates in the analysis model. The data of FIG. 11B indicates the cells of the analysis model in which the coupling devices are located.

The data in FIG. 11A is obtained by using the CAD data indicated in FIGS. 4A and 4B and data relevant to the electric conductivity, the magnetic permeability, the magnetic resistivity, and the density of the printed circuit board 34 included in the analysis conditions, to obtain the dielectric constant, the electric conductivity, the magnetic permeability, the magnetic resistivity, and the density of each cell in the analysis model.

The data indicated in FIG. 11B, in which the identifier of the coupling device is associated with coordinates in the analysis model, is obtained by cross-checking and associating the information relevant to the identifier of the coupling device and the terminal included in a net list of the electronic circuit module, with the coordinates of the terminal included in the CAD data indicated in FIG. 4C.

Alphanumeric symbols are used for expressing the dielectric constant, the electric conductivity, the magnetic permeability, the magnetic resistivity, and the density in FIG. 11A, and the (X, Y, Z) coordinates in FIG. 11B; however, specific values are used when the coupled analysis is actually performed.

Figure 12:
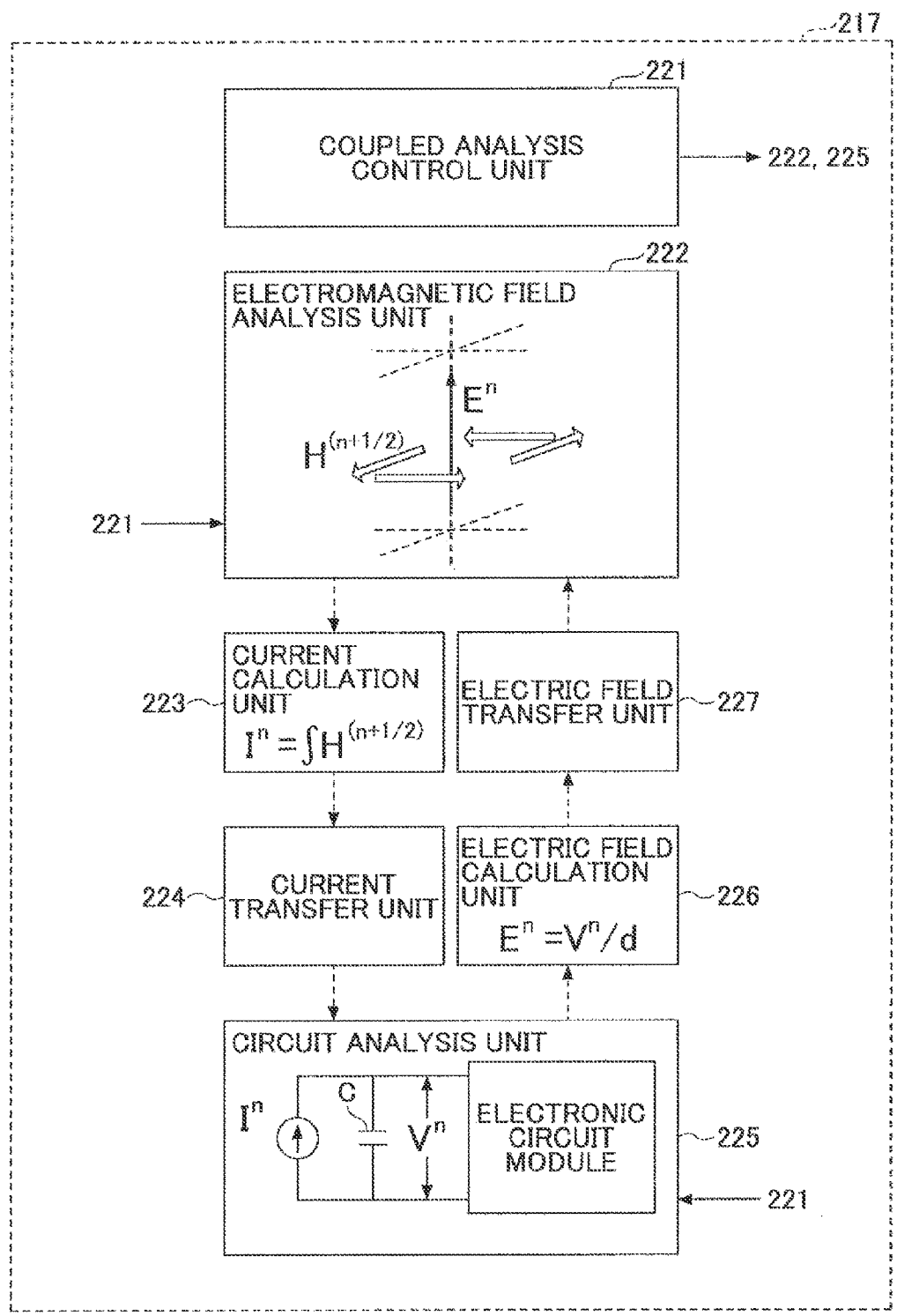
FIG. 12 is for describing the coupled analysis performed by the coupled analysis simulation apparatus according to the first embodiment of the present invention.

FIG. 12 is for describing the coupled analysis performed by the coupled analysis simulation apparatus according to the first embodiment of the present invention.

The coupled analysis is executed by the coupled analysis control unit 221, the electromagnetic field analysis unit 222, the current calculation unit 223, the current transfer unit 224, the circuit analysis unit 225, the electric field calculation unit 226, and the electric field transfer unit 227 included in the coupled analysis processing unit 217 (see FIG. 6).

The coupled analysis control unit 221 controls and manages the analysis time when executing the electromagnetic field analysis and the circuit analysis in coordination with each other. The coupled analysis control unit 221 defines the time $t_{em}01$, the time $t_{em}02$, and the time $t_{cs}$ that proceed at analysis time steps $\Delta t$. The time $t_{em}01$ is the time at which the electromagnetic field analysis unit 222 calculates the magnetic field. The time $t_{em}02$ is the time at which the electromagnetic field analysis unit 222 calculates the electric field. The time $t_{em}01$ and the time $t_{em}02$ are shifted from one another by a predetermined time ($\Delta t/2$). The time $t_{cs}$ is the time at which the circuit analysis unit 225 solves a circuit equation. The respective times are specifically defined by the following formulae (1) through (3).

$$t_{em}01 = (n-\tfrac{1}{2}) \times \Delta t \quad (1)$$

$$t_{em}02 = n \times \Delta t \quad (2)$$

$$t_{cs} = n \times \Delta t \quad (3)$$

In the above formulae, n is a natural number including 0, and when n is 0, $t_{em}01=0.0$, $t_{em}02=0.0$, and $t_{cs}=0.0$.

The electromagnetic field analysis unit 222 performs electromagnetic field analysis by the FDTD method in the analysis model (see FIG. 10) with respect to the space including the virtual conductive parts 110, the coupling devices 100, and the conductive layers 35, and alternately calculates the electric field E at the sides of each cell and the magnetic field H surrounding each cell. The electromagnetic field analysis unit 222 calculates the magnetic field H at the time $t_{em}01$ and calculates the electric field E at the time $t_{em}02$.

When the electromagnetic field analysis unit 222 receives, via the electric field transfer unit 227, an electric field value of a cell in which the coupling device 100 is present, the electromagnetic field analysis unit 222 uses the received electric field value to alternately perform a process of obtaining the electric field E and a process of obtaining the surrounding magnetic field H generated by the electric field E, for each cell in the analysis model. The electromagnetic field analysis unit 222 obtains the magnetic field H and the electric field E by the following formulae (4) and (5).

$$H^{(n+1/2)} = H^{(n-1/2)} - (\Delta t/\mu) rot E^n \quad (4)$$

$$E^n = E^{n-1} (\Delta t/\epsilon) rot H^{(n-1/2)} \quad (5)$$

In the above formulae, $\mu$ is the magnetic permeability, $\in$ is the dielectric constant, and $H^{-1/2}=0$.

The electromagnetic field analysis unit 222 calculates data expressing the magnetic field (hereinafter, "magnetic field data") and data expressing the electric field (hereinafter, "electric field data") for each of the cells in the analysis model at the analysis times. This data is stored in the HDD 24 by the data management unit 219. The magnetic data stored in the HDD 24 is used by the analysis result display processing unit 218 for obtaining a current value for reproducing the return path as the final result of coupled analysis.

The magnetic field and electric field include X, Y, Z components. The magnetic field of each cell is obtained by, for example, calculating six normal vectors (two normal vectors for each of the X, Y, Z axis directions) indicating the strength and direction of the magnetic fields intersecting the six surfaces of the cell, and obtaining the physical amounts including the strength and direction of an average vector of the two normal vectors for each axis. The electric field of each cell is obtained by, for example, calculating the electric fields in the 12 edges surrounding the cell (four sides for each of the X, Y, Z axes directions), and obtaining the physical amounts including the average strength of the electric fields in the four sides for each axis.

Among the magnetic fields calculated by the electromagnetic field analysis unit 222, the current calculation unit 223 performs contour integration on a magnetic field H calculated based on the coupling device 100 with the use of formula (6). Accordingly, the current calculation unit 223 calculates the current value I of the coupling device 100 at each of the times of analysis time steps.

$$I^n = \int H^{(n+1/2)} \quad (6)$$

The current value I of the coupling device 100 obtained by the current calculation unit 223 is transferred to the circuit analysis unit 225 by the current transfer unit 224.

The current transfer unit 224 performs a process of transferring, to the circuit analysis unit 225, the current value I calculated for the coupling device 100 by the current calculation unit 223. Accordingly, the circuit analysis unit 225 performs a circuit analysis process with the use of the current value I of the coupling device 100 calculated by the current calculation unit 223.

For example, the circuit analysis unit 225 performs the circuit analysis by SPICE (Simulation Program with Integrated Circuit Emphasis), with the use of an equivalent circuit using a current source method. The equivalent circuit includes a current source I connected between both terminals of the electronic circuit module, and a capacitor C connected in parallel with the current source I. The circuit analysis unit 225 uses the circuit equation (7) to obtain a voltage value V applied in between both terminals of the electronic circuit module. The current value of the current source I is set to the current value transferred from the current transfer unit 224. That is to say, the current value of the current source I is set to the current value of the coupling device 100.

$$V^n = Z^{-1} I^n \quad (7)$$

$Z^{-1}$ is the impedance matrix of the electronic circuit module.

When the current value of the coupling device 100 is received from the current transfer unit 224, the circuit analysis unit 225 updates the current value $I^n$ of the current source to the current value that has been received, and executes the circuit analysis at the time $t_{cs}$.

The electric field calculation unit 226 uses formula (8) to divide the voltage value V obtained by the circuit analysis unit 225 by the length d of each side of the cell, and obtain an electric field value E of the cell in which the coupling device 100 is present.

$$E^n = V^n/d \quad (8)$$

The electric field value E obtained by the electric field calculation unit 226 is transferred to the electromagnetic field analysis unit 222 by the electric field transfer unit 227.

The electric field transfer unit 227 transfers, to the electromagnetic field analysis unit 222, the electric field value of the coupling device 100 calculated by the electric field calculation unit 226.

Next, when the electric field value of the coupling device 100 calculated by the electric field calculation unit 226 has been received, the electromagnetic field analysis unit 222 uses formula (5) to calculate the electric field value for a cell other than cells in which the coupling device 100 is present, and uses formula (4) to calculate the magnetic field value of such cells.

In the coupled analysis simulation apparatus according to the first embodiment of the present invention, the processes performed by the electromagnetic field analysis unit 222, the current calculation unit 223, the current transfer unit 224, the circuit analysis unit 225, the electric field calculation unit 226, and the electric field transfer unit 227 are repeatedly executed.

FIG. 13 is an example of data that is a table of association between electric field values, current values, and identifiers of the coupling devices 100 used in the coupled analysis simulation apparatus according to the first embodiment of the present invention. The data indicated in FIG. 13 is obtained by calculating the electric field values E and the current values I of cells including the coupling device 100 having coordinates in the analysis model illustrated in FIG. 11B; eliminating the coordinates in the analysis model from the data; and associating the electric field values E and current values I with the identifiers (No.) of the coupling devices 100.

The electric field value indicated in FIG. 13 is a value of an electric field $E^k$ calculated by the electric field calculation unit 226 based on an electric field value V at a time $t_{cs} = k \times \Delta t$. The current value indicated in FIG. 13 is a value of a current $I^k$ calculated by the current calculation unit 223 based on a magnetic field H at a time $t_{em}01 = (k - \frac{1}{2}) \times \Delta t$. In the above equations, k is a natural number satisfying $0 \leq k \leq n$. The data indicated in FIG. 13 is created at every analysis time.

The data expressing the electric field values in FIG. 13 is transferred by the electric field transfer unit 227 to the electromagnetic field analysis unit 222, as electric field values of cells in which the coupling devices 100 are positioned. The data expressing the current values in FIG. 13 is transferred by the current transfer unit 224 to the circuit analysis unit 225, as current values of the coupling devices 100.

Alphanumeric symbols are used for expressing the electric field values and current values; however, specific values, which are obtained for the cells in which the coupling devices are positioned, are used as the electric field values and current values when the coupled analysis is actually performed.

Figure 14:
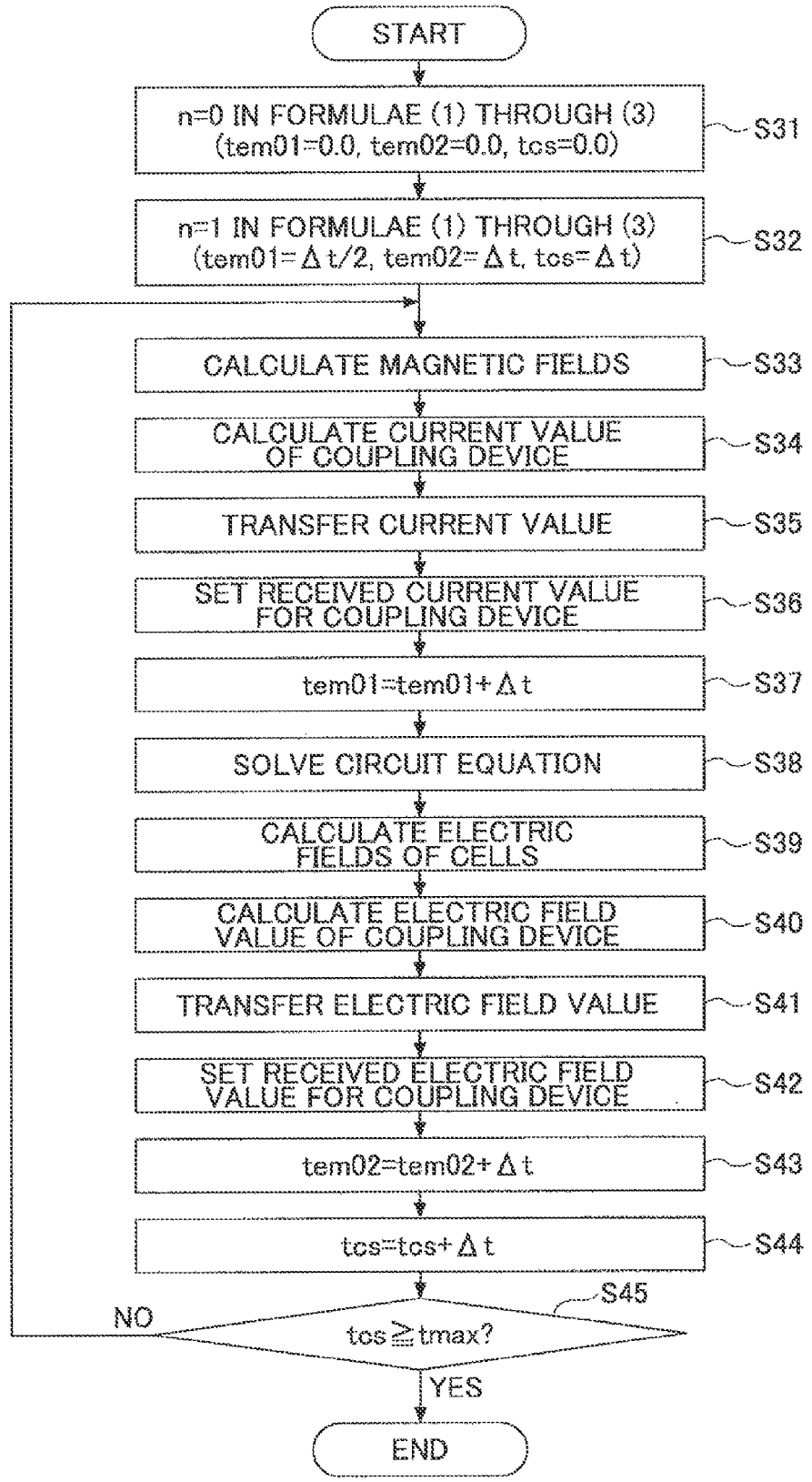
FIG. 14 is a flowchart of a coupled analysis process performed by the coupled analysis simulation apparatus according to the first embodiment of the present invention.

FIG. 14 is a flowchart of a coupled analysis process performed by the coupled analysis simulation apparatus according to the first embodiment of the present invention. The coupled analysis process is executed by the coupled analysis control unit 221, the electromagnetic field analysis unit 222, the current calculation unit 223, the current transfer unit 224, the circuit analysis unit 225, the electric field calculation unit 226, and the electric field transfer unit 227 included in the coupled analysis processing unit 217.

The coupled analysis control unit 221 sets zero as n in the above formulae (1) through (3) (step S31). Accordingly, the respective analysis times are initialized, i.e., the time $t_{em}01$ in electromagnetic field analysis is $t_{em}01 = 0.0$, the time $t_{em}02$ in electromagnetic field analysis is $t_{em}02 = 0.0$, and the time $t_{cs}$ in circuit analysis is $t_{cs} = 0.0$. The times defined by the coupled analysis control unit 221 are input to the electromagnetic field analysis unit 222 and the electric field transfer unit 227.

Next, the coupled analysis control unit 221 sets 1 as n in the above formulae (1) through (3), so that the times are $t_{em}01 = \Delta t/2$, $t_{em}02 = \Delta t$, and $t_{cs} = \Delta t$ (step S32).

The electromagnetic field analysis unit 222 calculates the magnetic fields of all cells by using formula (4) (step S33).

The current calculation unit 223 calculates the current value of the coupling device 100 with the use of the magnetic field calculated for the cell including the coupling device 100, among the magnetic fields calculated in step S33 (step S34). The current value is calculated by performing contour integration on the magnetic field H with the use of formula (6).

The current transfer unit 224 transfers, to the circuit analysis unit 225, the current value of the coupling device 100 calculated by the current calculation unit 223 (step S35).

The circuit analysis unit 225 sets the current value received from the current transfer unit 224 as the current value of the coupling device 100 (step S36). Accordingly, the current value $I^n$ of the current source is updated to the current value of the coupling device 100 obtained by electromagnetic field analysis.

The coupled analysis control unit 221 sets the time $t_{em}01$ in electromagnetic field analysis as $t_{em}01 = t_{em}01 + \Delta t$ (step S37). That is to say, the value of n for defining the analysis time in formula (1) is incremented, so that the time $t_{em}01$ of calculating the magnetic field proceeds by an analysis time step $\Delta t$.

The circuit analysis unit 225 uses the current value set in step S36 to solve the circuit equation (7) (step S38). Accordingly, the voltage value V of the coupling device 100 at the time $t_{cs}$ is obtained.

The electromagnetic field analysis unit 222 calculates the electric fields of all cells by formula (5), with the use of the magnetic fields calculated in step S33 (step S39).

The electric field calculation unit 226 obtains the electric field value E from the voltage value V of the coupling device 100 calculated in step S38 (step S40). This calculation is done with formula (8).

The electric field transfer unit 227 transfers the electric field value E obtained in step S40 to the electromagnetic field analysis unit 222 (step S41).

The electromagnetic field analysis unit 222 sets the electric field value received in step S41 as the electric field values of the cells in which the coupling device 100 is present (step S42). Accordingly, the electric field value of the coupling device 100 is updated to the value obtained by the circuit analysis.

The coupled analysis control unit 221 sets the time $t_{em}02$ in electromagnetic field analysis as $t_{em}02 = t_{em}02 + \Delta t$ (step S43). That is to say, the value of n for defining the analysis time in formula (2) is incremented, so that the time $t_{em}02$ of calculating the electric field proceeds by an analysis time step $\Delta t$.

The coupled analysis control unit 221 sets the time $t_{cs}$ in circuit analysis as $t_{cs} = t_{em}01$ (step S44). That is to say, the value of n for defining the analysis time in formula (3) is incremented, so that the time $t_{cs}$ in circuit analysis proceeds by an analysis time step $\Delta t$.

The circuit analysis unit 225 determines whether $t_{cs} \leq t_{max}$ is satisfied (step S45). When the determination is affirmative, the process ends, and when the determination is negative, the flow returns to step S33. In this formula, $t_{max}$ is the analysis time of electromagnetic field analysis, which is set in advance.

As described above, the current values and the electric field values of the coupling device 100 are transferred between the electromagnetic field analysis unit 222 and the circuit analysis unit 225 to perform coupled analysis by performing electromagnetic field analysis and circuit analysis in coordination with each other.

FIG. 15 indicates an example of data including electric field values and magnetic field values in cells in the analysis model used by the coupled analysis simulation apparatus according to the first embodiment of the present invention.

FIG. 16 indicates data expressing current values obtained for the cells by the analysis model used in the coupled analysis simulation apparatus according to the first embodiment of the present invention.

In FIGS. 15 and 16, alphanumeric symbols are used for expressing the electric field values, magnetic field values, and current values; however, specific values obtained for the cells are used when the coupled analysis is actually performed.

The data of FIG. 15 indicates values of a magnetic field $H^{(k+1/2)}$ at a time tem01=(k−½)×Δt and values of an electric field $E^k$ at a time tem02=k×Δt. In these formulae, k is a natural number satisfying 0≤k≤n.

The data in FIG. 15 is obtained by the electromagnetic field analysis unit 222 for all of the cells in the analysis model, by alternately calculating a magnetic field and an electric field with the use of formula (4) and formula (5), respectively. The data of the current values $I^k$ indicated in FIG. 16 is obtained by the analysis result display processing unit 218, by performing contour integration on the magnetic field $H^{(k+1/2)}$ of each cell in FIG. 15. The current values obtained for the cells are associated with the coordinates (X,Y,Z) of the analysis model as indicated in FIG. 16 and stored in the HDD 24. The current values stored in the HDD 24 are used as analysis results of the coupled analysis simulation apparatus according to the first embodiment of the present invention, when the analysis result display processing unit 218 causes the display screen 12A of the display 12 illustrated in FIG. 1 to display a return path to be reproduced in the power source layer or ground layer.

Figure 17A:
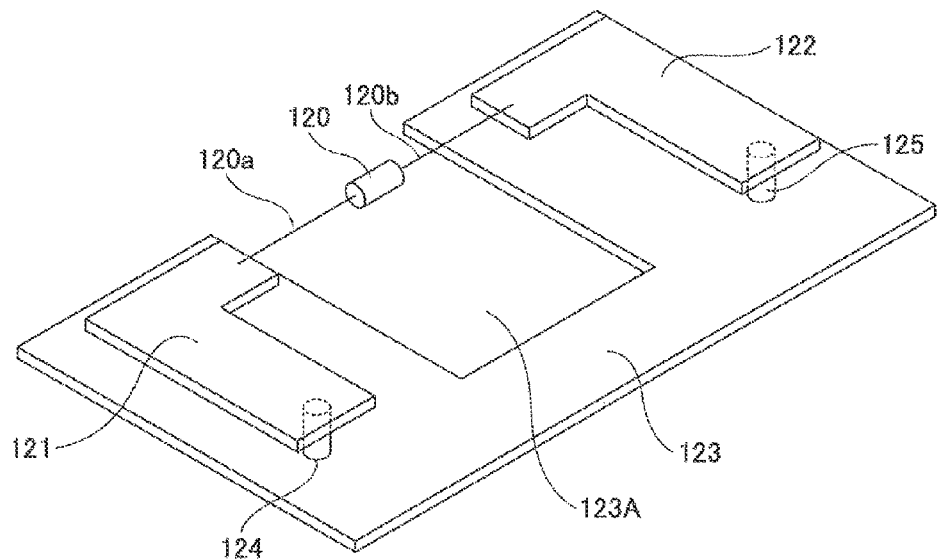
FIG. 17A is a perspective view of a part of a circuit in which an electronic circuit module is mounted.
Figure 17B:
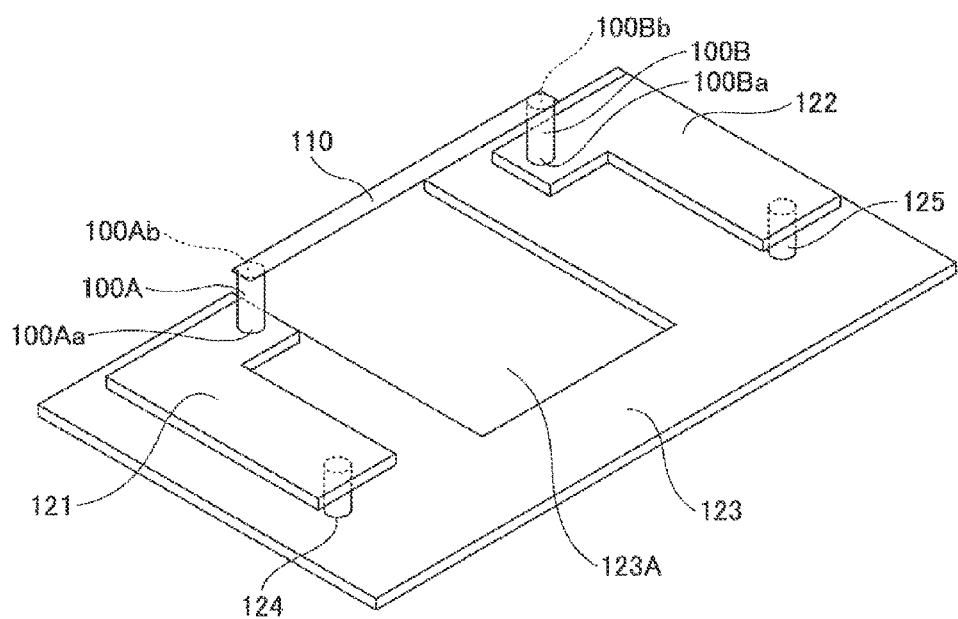
FIG. 17B is a perspective view of the circuit of FIG. 17A, in which a virtual conductive part and coupling devices are virtually disposed in the circuit.

Next, a description is given of a return path reproduced by the coupled analysis simulation apparatus according to the first embodiment of the present invention, with reference to a circuit illustrated in FIGS. 17A and 17B.

FIG. 17A is a perspective view of a part of a circuit in which an electronic circuit module is mounted. The circuit illustrated in FIG. 17A includes an electronic circuit module 120, wiring 121, wiring 122, a ground layer 123, an input port 124, and an output port 125. Dielectric layers of the printed circuit board are provided between the electronic circuit module 120, the wiring 121, the wiring 122, and the ground layer 123; however, the dielectric layers are not illustrated as a matter of convenience.

FIG. 17B is a perspective view of the circuit of FIG. 17A, in which circuit the virtual conductive part 110 and the coupling devices 100A and 100B are virtually disposed instead of the electronic circuit module 120 and the terminals 120a and 120b illustrated in FIG. 17A. In FIG. 17B, the dielectric layers are not illustrated as a matter of convenience.

As illustrated in FIG. 17A, the ground layer 123 has a notch 123A, and therefore the ground layer 123 has a U-shape in a planar view. The wiring 121 and the wiring 122 are formed on the ground layer 123 via the dielectric layers that are not illustrated. In between the wiring 121 and the wiring 122, the electronic circuit module 120 is connected in such a manner as to be positioned over the notch 123A of the ground layer 123. In FIG. 17A, a resistor is illustrated as the electronic circuit module 120; however, the electronic circuit module 120 may be another electronic circuit module having multiple terminals, such as the LSI 36.

The input port 124 connects the wiring 121 to the ground layer 123, and includes a current source for outputting a current of a predetermined current value. The output port 125 has a predetermined resistance value (typically 50 (Ω)), and connects the wiring 122 to the ground layer 123.

In FIG. 17A, a current that is output from the current source of the input port 124 is input as signals in the wiring 121, and is transmitted to the ground layer 123 via the electronic circuit module 120, the wiring 122, and the output port 125. On the surface of the ground layer 123, the signals are transmitted along the wiring 122. However, because there is the notch 123A, the signals are not transmitted along the electronic circuit module 120, but the signals are transmitted along the U-shape of the notch 123A, and along the wiring 121 until the signals reach the input port 124. Accordingly, the return path of signals in FIG. 17A diverts around the notch 123A of the ground layer 123.

In the coupled analysis simulation apparatus according to the first embodiment of the present invention, as illustrated in FIG. 17B, the electronic circuit module 120 and the terminals 120a and 120b are modeled, and the virtual conductive part 110 and coupling devices 100A and 100B are generated. The coupling device 100A is a virtual two-terminal device having one terminal 100Aa connected to a position where the terminal 120a of the electronic circuit module 120 is connected to the wiring 121. Similarly, the coupling device 100B is a virtual two-terminal device having one terminal 100Ba connected to a position where the terminal 120b of the electronic circuit module 120 is connected to the wiring 122.

In the first embodiment, the actual height between the electronic circuit module 120 and the wiring 121 and the wiring 122 is set as the heights of the coupling devices 100A and 100B. The positions and heights where the coupling devices 100A and 100B are connected to the wiring 121 and the wiring 122 are determined according to the coupling device data (see FIG. 8B).

The virtual conductive part 110 is defined so as to connect the other terminal 100Ab of the coupling device 100A to the other terminal 100Bb of the coupling device 100B. As a matter of convenience, the virtual conductive part 110 is illustrated as having a certain width in FIG. 17B. However, in the virtual conductive part data (see FIG. 8A), the virtual conductive part 110 connecting the terminals 100Ab and 100Bb is defined as a line.

In the example indicated in FIG. 8A, the virtual conductive part data includes coordinates of four vertices. However, the virtual conductive part data expressing the virtual conductive part 110 illustrated in FIG. 17B includes coordinates of two points (the terminals 100Aa and 100Ba).

Figure 18:
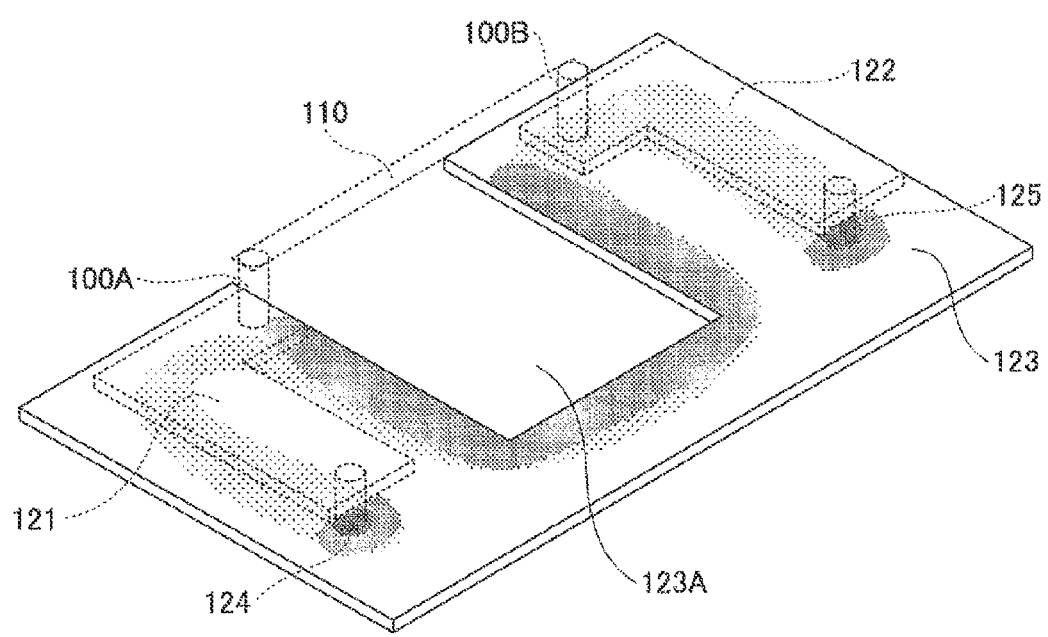
FIG. 18 illustrates the return path reproduced by the coupled analysis simulation apparatus according to the first embodiment of the present invention.

FIG. 18 illustrates the return path reproduced by the coupled analysis simulation apparatus according to the first embodiment of the present invention. The return path is displayed as analysis results of the coupled analysis simulation apparatus according to the first embodiment, on the display screen 12A of the display 12 illustrated in FIG. 1, by the analysis result display processing unit 218 (see FIG. 6). The return path is displayed as dots representing the distribution of current values indicated in FIG. 16, on the surface of the ground layer 123. The higher the density of the dots, the higher the current values. The lower the density of the dots, the lower the current values. In FIG. 18, the virtual conductive part 110, the wiring 121, the wiring 122, the input port 124, and the output port 125 are illustrated with dotted lines so that the return path is clearly viewable.

The return path illustrated in FIG. 18 is formed by reproducing a current pathway of signals on the surface of the ground layer 123. Specifically, the signals are input to the wiring 121 from the input port 124 illustrated in FIG. 17B, transmitted through the electronic circuit module 120, the wiring 122, the output port 125, and the ground layer 123, and are returned to the input port 124.

As illustrated in FIG. 18, the return path is accurately reproduced on the surface of the ground layer 123 by the coupled analysis simulation apparatus according to the first embodiment, starting from the output port 125, extending along the wiring 122, the notch 123A, and the wiring 121, and returning to the input port 124.

Next, a description is given of the return path reproduced by the coupled analysis simulation apparatus according to the first embodiment of the present invention, with reference to a circuit other than that illustrated in FIG. 17A.

FIG. 19A is a perspective view of a part of a circuit on which electronic circuit modules are mounted. FIG. 19B is a perspective view of the circuit of FIG. 19A, in which circuit virtual conductive parts and coupling devices are disposed.

The circuit illustrated in FIG. 19A includes electronic circuit modules 120A through 120C, wirings 121A through 121C and 122A through 122C, a ground layer 123, input ports 124A through 124C, and output ports 125A through 125C.

The input ports 124A through 124C respectively connect the wirings 121A through 121C to the ground layer 123, and include current sources that output currents of a predetermined current value. The output ports 125A through 125C have a predetermined resistance value (typically 50 (Ω)), and respectively connect the wirings 122A through 122C to the ground layer 123.

The electronic circuit modules 120A through 120C are respectively connected to the wirings 121A through 121C and 122A through 122C via terminals 120Aa through 120Ca and 120Ab through 120Cb.

Dielectric layers of the printed circuit board are provided between the electronic circuit modules 120A through 120C, the wirings 121A through 121C and 122A through 122C, and the ground layer 123; however, the dielectric layers are not illustrated as a matter of convenience.

In the circuit illustrated in FIG. 19A, the electronic circuit modules 120A through 120C are connected in parallel.

Signals that are input from the input port 124A to the wiring 121A are transmitted through the electronic circuit module 120A, the wiring 122A, and the output port 125A, and returned to the input port 124A along the wiring 122A, the electronic circuit module 120A, and the wiring 121A on the ground layer 123.

Signals that are input from the input port 124B to the wiring 121B are transmitted through the electronic circuit module 120B, the wiring 122B, and the output port 125B, and returned to the input port 124B along the wiring 122B, the electronic circuit module 120B, and the wiring 121B on the ground layer 123.

Signals that are input from the input port 124C to the wiring 121C are transmitted through the electronic circuit module 120C, the wiring 122C, and the output port 125C, and returned to the input port 124C along the wiring 122C, the electronic circuit module 120C, and the wiring 121C on the ground layer 123.

FIG. 19B illustrates virtual conductive parts 110A through 110C and coupling devices 108A through 108C and 109A through 109C, which are generated by modeling the electronic circuit modules 120A through 120C and the terminals 120Aa through 120Ca and 120Ab through 120Cb illustrated in FIG. 19A.

The coupling device 108A is a virtual connection part having one terminal 108Aa connected to a position where the terminal 120Aa of the electronic circuit module 120A is connected to the wiring 121A in FIG. 19A. The coupling device 108B is a virtual connection part having one terminal 108Ba connected to a position where the terminal 120Ba of the electronic circuit module 120B is connected to the wiring 121B in FIG. 19A. The coupling device 108C is a virtual connection part having one terminal 108Ca connected to a position where the terminal 120Ca of the electronic circuit module 120C is connected to the wiring 121C in FIG. 19A.

The coupling device 109A is a virtual connection part having one terminal 109Aa connected to a position where the terminal 120Ab of the electronic circuit module 120A is connected to the wiring 122A in FIG. 19A. The coupling device 109B is a virtual connection part having one terminal 109Ba connected to a position where the terminal 120Bb of the electronic circuit module 120B is connected to the wiring 122B in FIG. 19A. The coupling device 109C is a virtual connection part having one terminal 109Ca connected to a position where the terminal 120Cb of the electronic circuit module 120C is connected to the wiring 122C in FIG. 19A.

In the first embodiment, the actual heights of the electronic circuit modules 120A through 120C from the wirings 121A through 121C and 122A through 122C are set as the heights of the coupling devices 108A through 108C and 109A through 109C.

The positions and heights where the coupling devices 108A through 108C and 109A through 109C are connected to the wirings 121A through 121C and 122A through 122C are determined according to the coupling device data (see FIG. 8B).

The virtual conductive parts 110A through 110C are defined so as to connect terminals 108Ab through 108Cb of the coupling devices 108A through 108C to terminals 109Ab through 109Cb of the coupling devices 109A through 109C. As a matter of convenience, the virtual conductive parts 110A through 110C are illustrated as having a certain width in FIG. 19B. However, in the virtual conductive part data (see FIG. 8A), the virtual conductive parts 110A through 110C connecting the terminals 108Ab through 108Cb to the terminals 109Ab through 109Cb are defined as lines.

Each virtual conductive part data item expressing one of the virtual conductive parts 110A through 110C illustrated in FIG. 19B includes coordinates of two points (the terminals 108Aa through 108Ca and 109Aa through 109Ca).

FIG. 20 illustrates the return path reproduced on the circuit illustrated in FIG. 19B by the coupled analysis simulation apparatus according to the first embodiment of the present invention. The return path is displayed as analysis results of the coupled analysis simulation apparatus according to the first embodiment, on the display screen 12A of the display 12 illustrated in FIG. 1, by the analysis result display processing unit 218 (see FIG. 6).

The return path illustrated in FIG. 20 is reproduced on the surface of the ground layer 123, when signals are input to the electronic circuit modules 120A and 120C illustrated in FIG. 19A, but not input to the electronic circuit module 120B. The return path is indicated by dots in FIG. 20. The higher the density of the dots, the higher the current values. The lower the density of the dots, the lower the current values. In FIG. 20, elements except for the ground layer 123 are illustrated with dotted lines so that the return path is clearly viewable.

As illustrated in FIG. 20, the return path is accurately reproduced on the surface of the ground layer 123 along the wiring 121A, the virtual conductive part 110A, the wiring 122A, the wiring 121C, the virtual conductive part 110C, and the wiring 122C.

Next, as a matter of comparison, a description is given of return paths reproduced by a conventional coupled analysis simulation apparatus with reference to the circuits illustrated in FIGS. 17A and 19A.

Figure 21A:
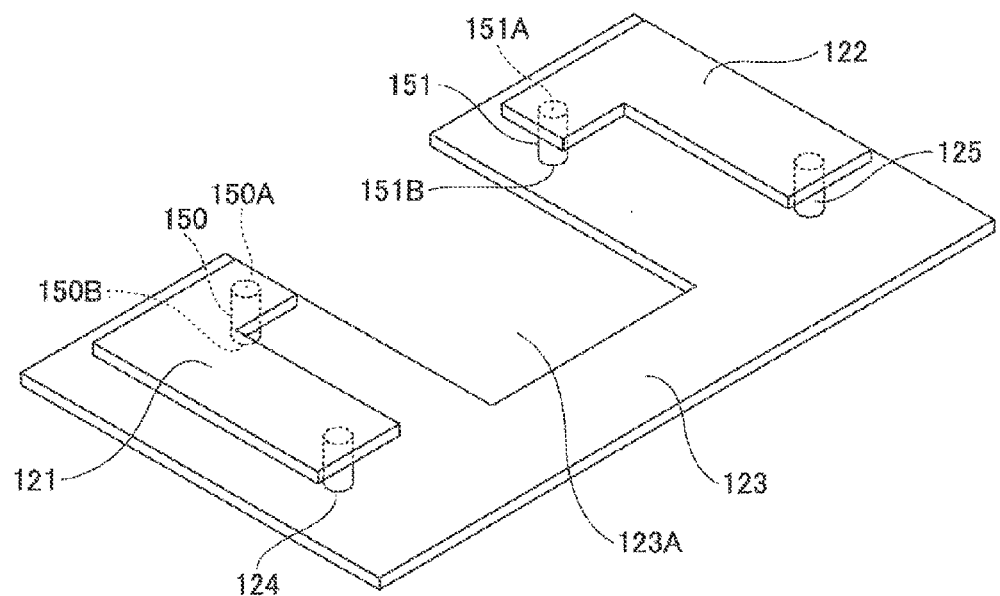
FIG. 21A is a perspective view of a circuit with coupling devices defined by a conventional coupled analysis simulation apparatus.
Figure 21B:
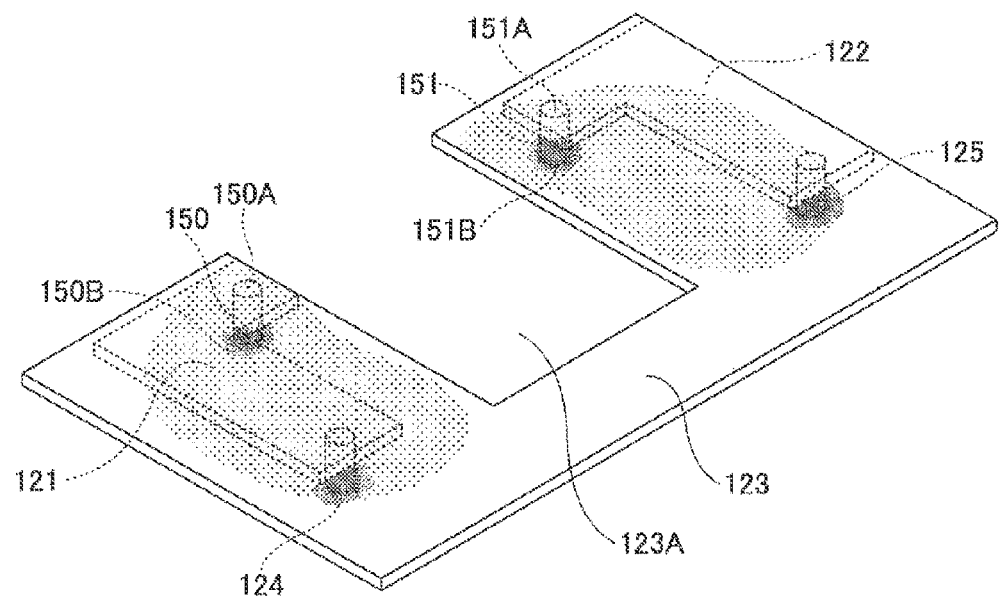
FIG. 21B illustrates a return path reproduced on the circuit illustrated in FIG. 21A by the conventional coupled analysis simulation apparatus.

FIG. 21A is a perspective view of a circuit with coupling devices defined by a conventional coupled analysis simulation apparatus. FIG. 21B illustrates a return path reproduced on the circuit illustrated in FIG. 21A by the conventional coupled analysis simulation apparatus. The return path is indicated by dots in FIG. 21B. The higher the density of the dots, the higher the current values. The lower the density of the dots, the lower the current values. In FIG. 21B, elements except for the ground layer 123 are illustrated with dotted lines so that the return path is clearly viewable.

The conventional coupling devices 150 and 151 illustrated in FIG. 21A are defined as conventional coupling devices of the terminals 120a and 120b of the electronic circuit module 120 illustrated in FIG. 17A. The conventional coupling devices 150 and 151 respectively include terminals 150A and 151A that are connected to the wiring 121 and the wiring 122, as well as terminals 150B and 151B that are connected to the nearest ground layer 123.

FIG. 21B illustrates a return path that is reproduced by the conventional coupled analysis simulation apparatus in which conventional coupling devices 150 and 151 are virtually connected to a circuit. The return path does not diverge around the notch 123A; the return path is separated on either side of the notch 123A. That is to say, the return path is reproduced at two separate positions on the ground layer 123, i.e., the position under the wiring 121 and the position under the wiring 122.

This is a typical example where the return path is not accurately reproduced. As described above, with the conventional coupled analysis simulation apparatus, there are cases where the return path is not accurately reproduced.

Next, a description is given of a return path reproduced by a conventional coupled analysis simulation apparatus with reference to the circuit illustrated in FIG. 19A.

FIG. 22A is a perspective view of a circuit with coupling devices defined by a conventional coupled analysis simulation apparatus. FIG. 22B illustrates a return path reproduced on the circuit illustrated in FIG. 22A by the conventional coupled analysis simulation apparatus. The return path is indicated by dots in FIG. 22B. The higher the density of the dots, the higher the current values. The lower the density of the dots, the lower the current values. In FIG. 22B, elements except for the ground layer 123 are illustrated with dotted lines so that the return path is clearly viewable.

The conventional coupling devices 152A through 152C and 153A through 153C illustrated in FIG. 22A are defined as conventional coupling devices of the terminals 120Aa through 120Ca and 120Ab through 120Cb of the electronic circuit modules 120A through 120C illustrated in FIG. 19A. The conventional coupling devices 152A, 152B, and 152C respectively include terminals 152Aa, 152Ba, and 152Ca that are connected to the wirings 121A, 121B, and 121C, as well as terminals 152Ab, 152Bb, and 152Cb that are connected to the nearest ground layer 123. Similarly, the conventional coupling devices 153A, 153B, and 153C respectively include terminals 153Aa, 153Ba, and 153Ca that are connected to the wirings 122A, 122B, and 122C, as well as terminals 153Ab, 153Bb, and 153Cb that are connected to the nearest ground layer 123.

Similar to the return path illustrated in FIG. 20, the return path illustrated in FIG. 22B is reproduced on the surface of the ground layer 123 by a conventional coupled analysis simulation apparatus when signals are input to the electronic circuit modules 120A and 120C illustrated in FIG. 19A but not input to the electronic circuit module 120B illustrated in FIG. 19A.

As illustrated in FIG. 22B, the return path reproduced by a conventional coupled analysis simulation apparatus is broken in between the wiring 121A and the wiring 122A, and is also broken in between the wiring 121C and the wiring 122C, on the surface of the ground layer 123.

As described above, with the conventional coupled analysis simulation apparatus, there are cases where the return path is not accurately reproduced. This is because the current pathway obtained by electromagnetic field analysis may be different from the actual path, when the conventional coupling devices 152A through 152C and 153A through 153C are connected to the nearest ground layer 123.

Meanwhile, the coupled analysis simulation apparatus according to the first embodiment of the present invention uses the virtual conductive parts 110 and the coupling devices 100 that are generated by modeling the electronic circuit modules and terminals. Therefore, the coupled analysis is performed on the electronic circuit modules in a state that is similar to the actual state in which the electronic circuit modules are actually connected to the conductive layers 35. Particularly, the electromagnetic field analysis involves processes of calculating the electric fields and magnetic fields of cells in the analysis model including the virtual conductive parts 110 and the coupling devices 100. Thus, it is possible to reproduce, with high precision, the electric fields and magnetic fields of the cells where the electronic circuit modules are actually positioned. Furthermore, based on the magnetic field that has been reproduced with high precision, it is possible to obtain, with high precision, the current value of the coupling device 100 to be transferred to (applied to) the circuit analysis process.

Accordingly, with the coupled analysis simulation apparatus according to the first embodiment of the present invention, it is possible to accurately reproduce the return path as illustrated in FIGS. 18 and 20.

Furthermore, in the coupled analysis simulation apparatus according to the first embodiment of the present invention, all of the coupling devices 100 are connected to the virtual conductive parts 110, and therefore there is no need to determine where the coupling devices 100 are to be connected.

Therefore, even when the electronic circuit modules have a large number of terminals, and it is thus difficult to recognize the current pathway inside the electronic circuit modules, the connection process is completed simply by connecting all of the coupling devices 100 to the virtual conductive parts 110. Accordingly, the modeling process is very simple.

Furthermore, in the conventional technology, even if it is correctly determined where the coupling devices are to be connected, the following problem may arise. That is, there may be cases where there are so many terminals that it is difficult to properly connect the coupling devices. Meanwhile, with the coupled analysis simulation apparatus according to the first embodiment of the present invention, the connection process is completed simply by connecting all of the coupling devices 100 to the virtual conductive parts 110, and therefore the connection process of the coupling devices 100 is very simple. Accordingly, the return path is accurately reproduced.

In the above-described embodiment, the actual height of the electronic circuit module from the topmost or bottommost conductive layer is set as the height of the virtual conductive part 110; however, the height of the virtual conductive part 110 may be a value different from the actual height of the electronic circuit module. For example, a predetermined height that is determined in advance in the analysis conditions may be set as the height of the virtual conductive part 110.

Furthermore, in the above-described embodiment, all connection parts connecting the electronic circuit modules and the conductive layers (for example, the bumps 38A through 38E, the terminals 37A and 37B) are modeled as the coupling devices 100, and all of the coupling devices 100 are connected to the virtual conductive parts 110. However, not all of the connection parts between the electronic circuit modules and conductive layers need to be modeled as the coupling devices 100. Only some of the connection parts may be modeled as the coupling devices 100. Furthermore, only some of the coupling devices 100 (generated as a result of the modeling) may be connected to the virtual conductive parts 110.

Furthermore, in the above-described embodiment, the virtual conductive part 110 has a linear shape or a planar shape that does not have a thickness; however, the virtual conductive part 110 may be defined as having a certain thickness.

Furthermore, in the above-described embodiment, the time $t_{em}01$, the time $t_{em}02$, and the time $t_{cs}$ proceed by the same analysis time steps $\Delta t$; however, the time $t_{em}01$, the time $t_{em}02$, and the time $t_{cs}$ may proceed by different analysis time steps. Alternatively, two out of the three of the times $t_{em}01$, $t_{em}02$, and time $t_{cs}$ may proceed by the same analysis time step.

<Second Embodiment>

FIG. 23 illustrates the connection of a virtual conductive part and coupling devices that are defined by a coupled analysis simulation apparatus according to a second embodiment of the present invention.

In the first embodiment, each of the electronic circuit modules is modeled to generate separate virtual conductive parts. However, in the second embodiment, a common virtual conductive part is generated for plural electronic circuit modules, which is the point different from that of the first embodiment. The following description mainly concerns different aspects from the first embodiment, and elements corresponding to the coupled analysis simulation apparatus according to the first embodiment are denoted by the same reference numerals and are not further described.

Coupling devices 201 through 207 according to the second embodiment illustrated in FIG. 23 are embodiments of virtual connection parts generated by modeling the bumps 38A through 38E and the terminals 37A and 37B illustrated in FIG. 5A.

The coupling devices 201 through 207 include terminals 201A through 207A that are connected to the same conductive layers as those to which the terminals have been connected before being modeled (any of conductive layers 35A through 35D). Furthermore, the coupling devices 201 through 207 include terminals 201B through 207B that are connected to a virtual conductive part 210. The coupled analysis simulation apparatus according to the second embodiment uses the coupling devices 201 through 207 that are two-terminal devices to connect the conductive layers 35A through 35D to the virtual conductive part 210. The coupling devices 201 through 207 are defined as perfect conductors. In this example, perfect conductors have an electric resistance of zero.

The virtual conductive part 210 is generated as a common virtual conductive part corresponding to the LSI 36 and the bypass capacitor 37, by modeling the LSI 36 and the bypass capacitor 37 illustrated in FIG. 5A. The virtual conductive part 210 is defined as a perfect conductor.

In the second embodiment, the virtual conductive part 210 corresponding to two electronic circuit modules, i.e., the LSI 36 and the bypass capacitor 37, is generated as a common virtual conductive part corresponding to plural electronic circuit modules. However, the common virtual conductive part may correspond to any number of electronic circuit modules. For example, a common virtual conductive part may be generated for all electronic circuit modules mounted on one side of the printed circuit board 34, or a common virtual conductive part may be generated for some of the electronic circuit modules. Furthermore, the printed circuit board 34 may be divided into several regions, and a common virtual conductive part may be generated for each of the regions.

Furthermore, in the second embodiment, the coupling devices 201 through 207 and the virtual conductive part 210 are defined as perfect conductors; however, the coupling devices 201 through 207 and the virtual conductive part 210 may be defined as conductors other than perfect conductors.

In the following, the coupling devices 201 through 207 may be referred to as a coupling device 200, when the coupling devices 201 through 207 are not particularly distinguished from one another.

Figure 24:
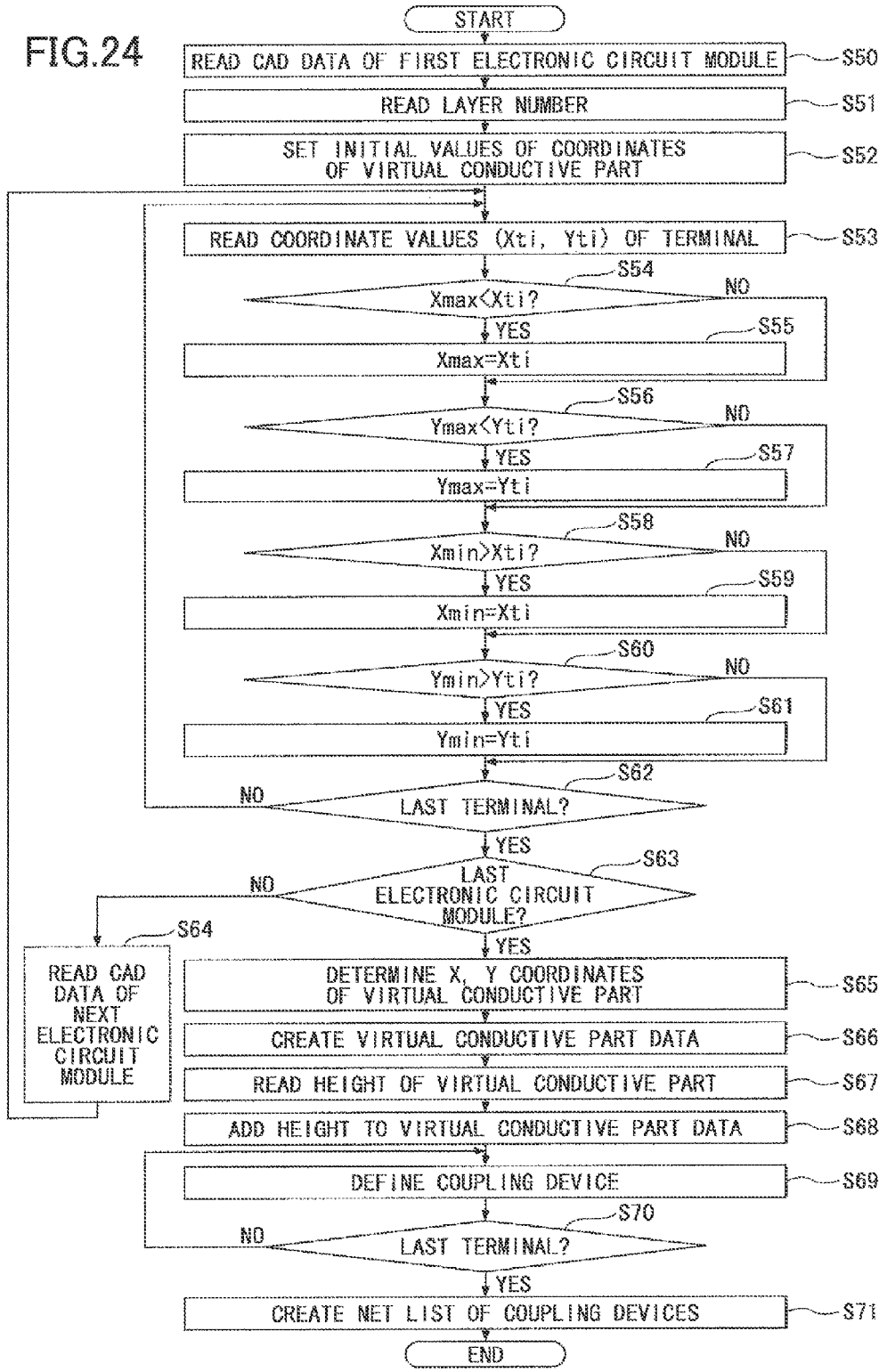
FIG. 24 is a flowchart of a process for generating a virtual conductive part and coupling devices performed by the coupled analysis simulation apparatus according to the second embodiment of the present invention.

Next, a description is given of a process of generating the coupling devices 201 through 207 and the virtual conductive part 210 with reference to FIG. 24.

FIG. 24 is a flowchart of a process for generating a virtual conductive part and coupling devices performed by the coupled analysis simulation apparatus according to the second embodiment of the present invention. The process illustrated in FIG. 24 is what the main control unit 211 inside the CPU 21 causes the virtual conductive part generating unit 214 and the virtual connection part generating unit 215 to execute. This process is executed according to analysis conditions created by the analysis condition creating unit 213.

The process illustrated in FIG. 24 is applied to a case of generating the planar virtual conductive part 210 that is specified by four vertices. Coordinates of the four vertices are (Xmin, Ymin), (Xmin, Ymax), (Xmax, Ymin), and (Xmax, Ymax).

When the main control unit 211 starts the flow of the process, the virtual conductive part generating unit 214 reads the CAD data (see FIG. 4C) corresponding to the electronic circuit module having the lowest identifier number among the electronic circuit modules included in the analysis conditions (step S50).

Next, the virtual conductive part generating unit 214 reads the layer number of the conductive layer 35 on which the electronic circuit module (CAD data) read in step S50 is mounted (step S51). For example, when the electronic circuit module of the corresponding identifier (No.) in the CAD data indicated in FIG. 4C has a layer number of 1, the virtual conductive part generating unit 214 recognizes that this electronic circuit module is mounted on the topmost layer. When the electronic circuit module of the corresponding identifier (No.) in the CAD data indicated in FIG. 4C has a layer number of 4, the virtual conductive part generating unit 214 recognizes that this electronic circuit module is mounted on the bottommost layer. When the electronic circuit module specified in the analysis conditions has an identifier of 1, and this identifier corresponds to the identifier of the LSI 36 illustrated in FIG. 5A, the layer number of the LSI 36 is read, so that the virtual conductive part generating unit 214 recognizes whether the LSI 36 is mounted on the conductive layer 35A that is the topmost layer or the conductive layer 35D that is the bottommost layer.

The virtual conductive part generating unit 214 specifies the X, Y coordinates of the terminal having the smallest terminal number among the terminals of the electronic circuit module having the smallest identifier indicated in the analysis conditions, as the initial X, Y coordinates expressing the position of the virtual conductive part 210 (step S52).

The initial values of the coordinates are specified as follows. Specifically, Xmin and Xmax are specified as the X coordinates of the terminal having the smallest terminal number, and Ymin and Ymax are specified as the Y coordinates of the terminal having the smallest terminal number. For example, when the electronic circuit module having an identifier (No.) 1 indicated in FIG. 4C is specified in the analysis conditions, the coordinates (Xt1, Yt1) of terminal 1 are read, and the initial values of the coordinates are specified as Xmin=Xmax=Xt1, Ymin=Ymax=Yt1.

The virtual conductive part generating unit 214 reads, from the CAD data, the coordinates (Xti, Yti) of the terminal (step S53). The process flow repeatedly returns to step S53 (after step S64) to sequentially read the coordinates of the terminals in an ascending order of terminal numbers. When the process proceeds from step S52 to step S53, the virtual conductive part generating unit 214 reads, from the CAD data, the coordinates (Xti, Yti) of the terminal having the next smallest terminal number among the terminal numbers relevant to the electronic circuit module read in step S50. For example, when the virtual conductive part generating unit 214 has read, in step S52, the coordinates (Xt1, Yt1) of terminal 1 of the electronic circuit module having an identifier (No.) 1 indicated in FIG. 4C, the virtual conductive part generating unit 214 reads, in step S53, coordinates (Xt2, Yt2) of terminal 2.

Next, the virtual conductive part generating unit 214 determines whether Xmax<Xti is satisfied with respect to the X coordinate (Xti) of the coordinates (Xti, Yti) of the terminal read in step S53 (step S54).

When the virtual conductive part generating unit 214 determines that Xmax<Xti is satisfied in step S54 (Yes in steps S54), the virtual conductive part generating unit 214 sets Xti as Xmax (step S55). Accordingly, the value of Xmax is set to an even larger value Xti.

When the virtual conductive part generating unit 214 determines that Xmax<Xti is not satisfied in step S54 (No in steps S54), or when the process of step S55 has ended, the virtual conductive part generating unit 214 determines whether Ymax<Yti is satisfied with respect to the Y coordinate (Yti) of the coordinates (Xti, Yti) (step S56).

When the virtual conductive part generating unit 214 determines that Ymax<Yti is satisfied in step S56 (Yes in step S56), the virtual conductive part generating unit 214 sets Yti as Ymax (step S57). Accordingly, the value of Ymax is set to an even larger value Yti.

When the virtual conductive part generating unit 214 determines that Ymax<Yti is not satisfied in step S56 (No in step S56), or when the process of step S57 has ended, the virtual conductive part generating unit 214 determines whether Xmin>Xti is satisfied with respect to the X coordinate (Xti) of the coordinates (Xti, Yti) (step S58).

When the virtual conductive part generating unit 214 determines that Xmin>Xti is satisfied in step S58 (Yes in step S58), the virtual conductive part generating unit 214 sets Xti as Xmin (step S59). Accordingly, the value of Xmin is updated to an even smaller value Xti.

When the virtual conductive part generating unit 214 determines that Xmin>Xti is not satisfied in step S58 (No in step S58), or when the process of step S59 has ended, the virtual conductive part generating unit 214 determines whether Ymin>Yti is satisfied with respect to the Y coordinate (Yti) of the coordinates (Xti, Yti) (step S60).

When the virtual conductive part generating unit 214 determines that Ymin>Yti is satisfied in step S60 (Yes in step S60), the virtual conductive part generating unit 214 sets Yti as Ymin (step S61). Accordingly, the value of Ymin is updated to an even smaller value Yti.

Next, the virtual conductive part generating unit 214 determines whether the currently processed terminal is the last terminal (step S62). The process of step S62 is for determining whether steps S53 through S61 have been completed for all of the terminals specified in the analysis conditions. The virtual conductive part generating unit 214 determines whether the currently processed terminal is the last terminal based on the terminal number of the terminal of the electronic circuit module included in the analysis results.

When the virtual conductive part generating unit 214 determines, in step S62, that the currently processed terminal is not the last terminal (No in step S62), the flow returns to step S53. Thereafter, steps S53 through S62 are repeated, so that the coordinate values of Xmax, Xmin, Ymax, and Ymin are updated for all terminals included in the analysis conditions. Accordingly, all of the terminals specified for the electronic circuit module that is the process target are included in the virtual conductive part 210, which is expressed by the four vertices (Xmin, Ymin), (Xmin, Ymax), (Xmax, Ymin), and (Xmax, Ymax), within the XY plane.

When the virtual conductive part generating unit 214 determines, in step S62, that the currently processed terminal is the last terminal (Yes in step S62), the virtual conductive part generating unit 214 determines whether the currently processed electronic circuit module is the last electronic circuit module included in the analysis conditions (step S63).

When the virtual conductive part generating unit 214 determines, in step S63, that the currently processed electronic circuit module is not the last electronic circuit module (No in step S63), the virtual conductive part generating unit 214 reads the CAD data of the next electronic circuit module in the analysis conditions (step S64). In step S64, the CAD data of the electronic circuit module having the next smallest identifier is read.

When step S64 ends, the virtual conductive part generating unit 214 returns to step S53. The process flow repeatedly returns to step S53 (after step S64) to sequentially read the coordinates of the terminals in an ascending order of terminal numbers with respect to the electronic circuit module read in step S64.

When the virtual conductive part generating unit 214 determines, in step S63, that the currently processed electronic circuit module is the last electronic circuit module (Yes in step S63), the virtual conductive part generating unit 214 determines the values of Xmax, Xmin, Ymax, and Ymin (step S65). Accordingly, the four vertices of the virtual conductive part 210 are determined as (Xmin, Ymin), (Xmin, Ymax), (Xmax, Ymin), and (Xmax, Ymax).

For example, when the bumps 38A through 38E of the LSI 36 and the terminals 37A and 37B of the bypass capacitor 37 illustrated in FIG. 5A are specified in the analysis conditions, the vertices of the virtual conductive part 210 illustrated in FIG. 23 are determined.

The virtual conductive part generating unit 214 creates virtual conductive part data, by associating the coordinates of the four vertices determined in step S65 with the identifier of the virtual conductive part 110 (step S66). The virtual conductive part data is obtained by associating the identifier, the X, Y coordinate values of the four vertices, and the height of the virtual conductive part 210, as in the CAD data.

Next, the virtual conductive part generating unit 214 reads the height (h) of the virtual conductive part 210 included in the analysis conditions (step S67). This step is performed to set a value created by the analysis condition creating unit 213 in advance as the height between the virtual conductive part 210 and the front surface (or back surface) of the printed circuit board 34.

Next, the virtual conductive part generating unit 214 adds, to the virtual conductive part data, the layer number read in step S51 and the height of the virtual conductive part 210 read in step S67 (step S68). When the virtual conductive part generating unit 214 has recognized that the corresponding conductive layer 35 is the topmost layer in step S51, the height of the virtual conductive part 210 is registered as +h. When the virtual conductive part generating unit 214 has recognized that the corresponding conductive layer 35 is the bottommost layer in step S51, the height of the virtual conductive part 210 is registered as −h.

The layer number is registered as data for expressing the layer on which the electronic circuit module is mounted.

Next, the virtual connection part generating unit 215 defines the coupling device 200 (step S69). In the coupled analysis simulation apparatus according to the second embodiment of the present invention, each coupling device 200 is defined to be at a position of one of the terminals included in the analysis conditions. The coupling device 200 is a virtual connection part that virtually connects the conductive layers 35 to the virtual conductive part 210. Thus, the positions of both terminals of the coupling device 200, which is a two-terminal device, are identified. This identification is done by associating the X, Y coordinates of the terminal included in the analysis conditions among the terminals included in the CAD data indicated in FIG. 4C, with the layer number and height of the virtual conductive part 210 registered in step S68. In the coupled analysis simulation apparatus according to the second embodiment of the present invention, the coupling device 200 is defined by associating the identifier of the coupling device 200, X, Y coordinates, the layer number, and the height.

Specifically, the virtual connection part generating unit 215 sequentially reads the X, Y, coordinates of the terminals included in the analysis conditions one by one starting from the smallest terminal number. In step S69, the virtual connection part generating unit 215 associates the X, Y coordinates of the corresponding terminal with the layer number and the height of the virtual conductive part 210 registered in step S68, and gives an identifier to the coupling device 200.

The height of the coupling device 200 is expressed by +h or −h; +h is the height between the coupling device 200 and the topmost conductive layer 35, and −h is the height between the coupling device 200 and the bottommost conductive layer 35. The layer number expresses whether the position where the coupling device 200 is defined is on the topmost layer or the bottommost layer.

The virtual connection part generating unit 215 determines whether the terminal defining the coupling device 200 processed in step S69 is the last terminal (step S70). The terminals included in the analysis conditions are selected one by one starting from the smallest terminal number to define each coupling device, and the selected terminal is processed in step S69. Therefore, step S69 is repeatedly performed until it is determined in step S70 that the processed terminal is the last terminal.

As the process of step S69 is repeated, multiple coupling device data items are created, in which the identifier of the coupling device 200, the X, Y coordinates, and the height are associated with each other.

Next, the virtual connection part generating unit 215 creates a net list of the coupling devices 200 (step S71).

When the virtual connection part generating unit 215 has created a net list in step S71, the series of steps for defining the virtual conductive part 210 and the coupling devices 200 are ended.

The coupled analysis simulation apparatus according to the second embodiment of the present invention uses the virtual conductive part 110 and the coupling devices 200 that are generated by modeling the electronic circuit modules and terminals. Therefore, the coupled analysis is performed on the electronic circuit modules in a state that is similar to the actual state in which the electronic circuit modules are actually connected to the conductive layers 35. Particularly, the electromagnetic field analysis involves processes of calculating the electric fields and magnetic fields of cells in the analysis model including the virtual conductive part 210 and the coupling devices 100. Thus, it is possible to reproduce, with high precision, the electric fields and magnetic fields of the cells where the electronic circuit modules are actually positioned. Furthermore, based on the magnetic field that has been reproduced with high precision, it is possible to obtain, with high precision, the current value of the coupling devices 200 to be transferred to (applied to) the circuit analysis.

Accordingly, with the coupled analysis simulation apparatus according to the second embodiment of the present invention, it is possible to accurately reproduce the return path, similar to the coupled analysis simulation apparatus according to the first embodiment of the present invention.

Furthermore, in the second embodiment, the virtual conductive part 210 that is common to plural electronic circuit modules is generated. Therefore, in the second embodiment, the process for generating the virtual conductive part 210 is further simplified than that of the first embodiment. Accordingly, in the second embodiment, it is possible perform coupled analysis with fewer calculation steps compared to the first embodiment.

Furthermore, in the coupled analysis simulation apparatus according to the second embodiment of the present invention, all of the coupling devices 200 are connected to the virtual conductive part 210, and therefore there is no need to determine where the coupling devices 200 are to be connected.

Therefore, even when the electronic circuit modules have a large number of terminals, and it is thus difficult to recognize the current pathway inside the electronic circuit modules, the connection process is completed simply by connecting all of the coupling devices 200 to the virtual conductive part 210. Accordingly, the process of modeling the electronic circuit module and terminals is very simple.

Furthermore, in the conventional technology, even if it is correctly determined where the coupling devices are to be connected, the following problem may arise. That is, there may be cases where there are so many terminals that it is difficult to properly connect the coupling devices. Meanwhile, with the coupled analysis simulation apparatus according to the second embodiment of the present invention, the connection process is completed simply by connecting all of the coupling devices 200 to the virtual conductive part 210, and therefore the connection process of the coupling devices 200 is very simple. Accordingly, the return path is accurately reproduced.

<Third Embodiment>

Figure 25:
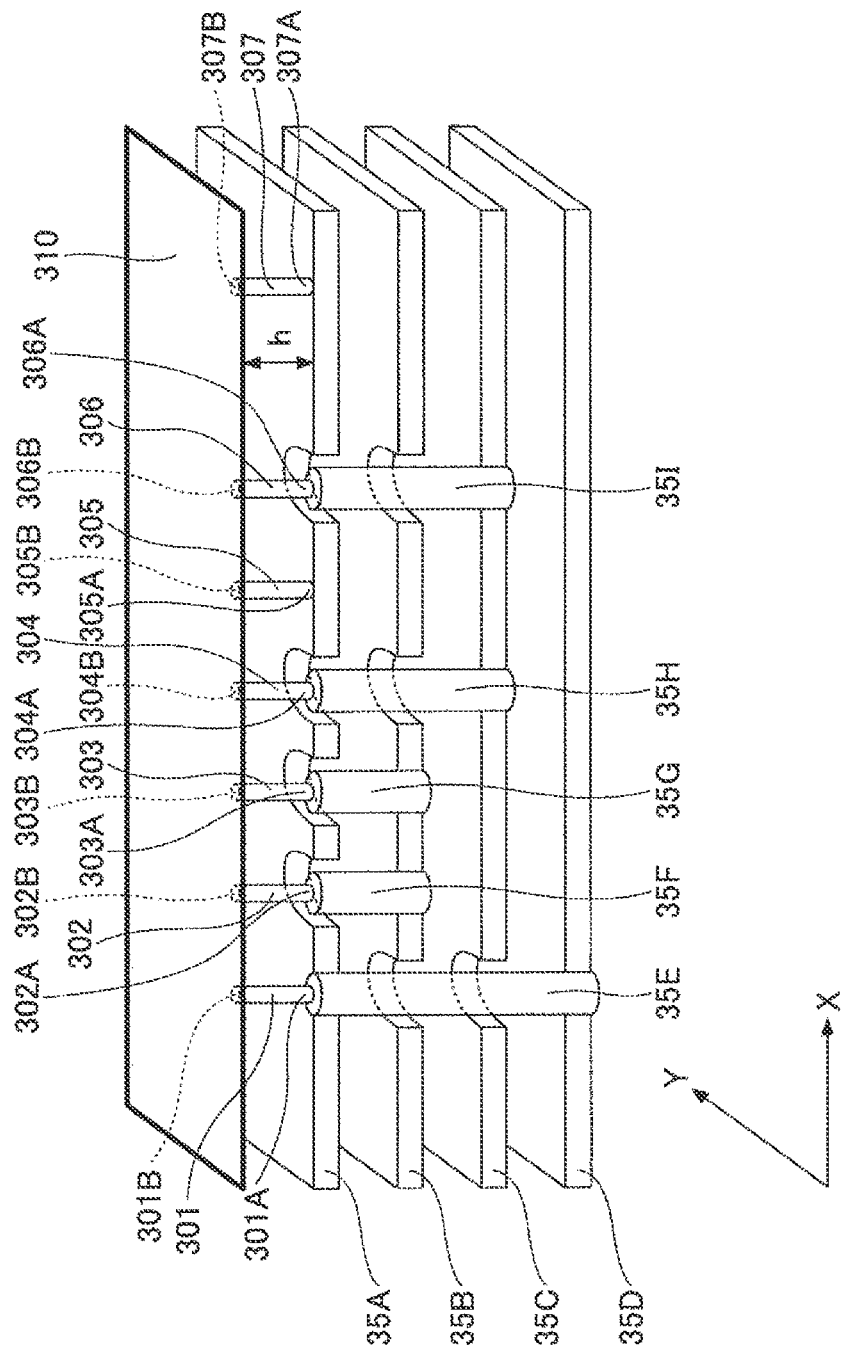
FIG. 25 illustrates the connection of a virtual conductive part and coupling devices that are defined by a coupled analysis simulation apparatus according to a third embodiment of the present invention.

FIG. 25 illustrates the connection of a virtual conductive part and coupling devices that are defined by a coupled analysis simulation apparatus according to a third embodiment of the present invention.

The third embodiment is different from the first embodiment in that a virtual conductive part 310 is generated, which has the same size as the printed circuit board 34 in a planar view. All of the coupling devices, which are generated by modeling the terminals of all of the electronic circuit modules in the analysis conditions, are connected to the virtual conductive part 310.

The following description mainly concerns different aspects from the first embodiment, and elements corresponding to the coupled analysis simulation apparatus according to the first embodiment are denoted by the same reference numerals and are not further described.

Coupling devices 301 through 307 according to the third embodiment illustrated in FIG. 25 are embodiments of virtual connection parts generated by modeling the bumps 38A through 38E and the terminals 37A and 37B illustrated in FIG. 5A.

The coupling devices 301 through 307 include terminals 301A through 307A that are connected to the same conductive layers as those to which the terminals have been connected before being modeled (any of conductive layers 35A through 35D). Furthermore, the coupling devices 301 through 307 include terminals 301B through 307B that are connected to the virtual conductive part 310. The coupled analysis simulation apparatus according to the third embodiment uses the coupling devices 301 through 307 that are two-terminal devices to connect the conductive layers 35A through 35D to the virtual conductive part 310. The coupling devices 301 through 307 are defined as perfect conductors. In this example, perfect conductors have an electric resistance of zero.

The virtual conductive part 310 is set as a plane having the same size as the printed circuit board 34 in a planar view. FIG. 25 illustrates only the coupling devices 301 through 307 that have been generated by modeling the bumps 38A through 38E of the LSI 36 and the terminals 37A and 37B of the bypass capacitor 37 (see FIG. 5A). However, actually terminals of all electronic circuit module specified in the analysis conditions are modeled, and therefore coupling devices other than the coupling devices 301 through 307 may be generated as well.

The virtual conductive part 310 has the same size as the printed circuit board 34 in a planar view, and is therefore connected to all of the coupling devices defined on either the topmost layer or the bottommost layer of the printed circuit board 34.

In the third embodiment, the coupling devices 301 through 307 and the virtual conductive part 310 are defined as perfect conductors; however, the coupling devices 301 through 307 and the virtual conductive part 310 may be defined as conductors other than perfect conductors.

In the following, the coupling devices 301 through 307 may be referred to as coupling devices 300, when the coupling devices 301 through 307 are not particularly distinguished from one another.

FIG. 26 illustrates an example of CAD data expressing the size of the printed circuit board used by the coupled analysis simulation apparatus according to the third embodiment of the present invention.

In the third embodiment, the printed circuit board 34 is a rectangle in a planar view. Therefore, the data expressing the size of the printed circuit board indicates coordinates of four vertices of the printed circuit board 34 in an X, Y coordinate plane, as indicated in FIG. 26.

In FIG. 26, alphanumeric symbols are used for expressing the coordinates of the four vertices of the printed circuit board 34; however, when the coupled analysis is actually performed, specific values expressing X, Y coordinates corresponding to the positions of the four vertices of the printed circuit board 34 are used.

Figure 27:
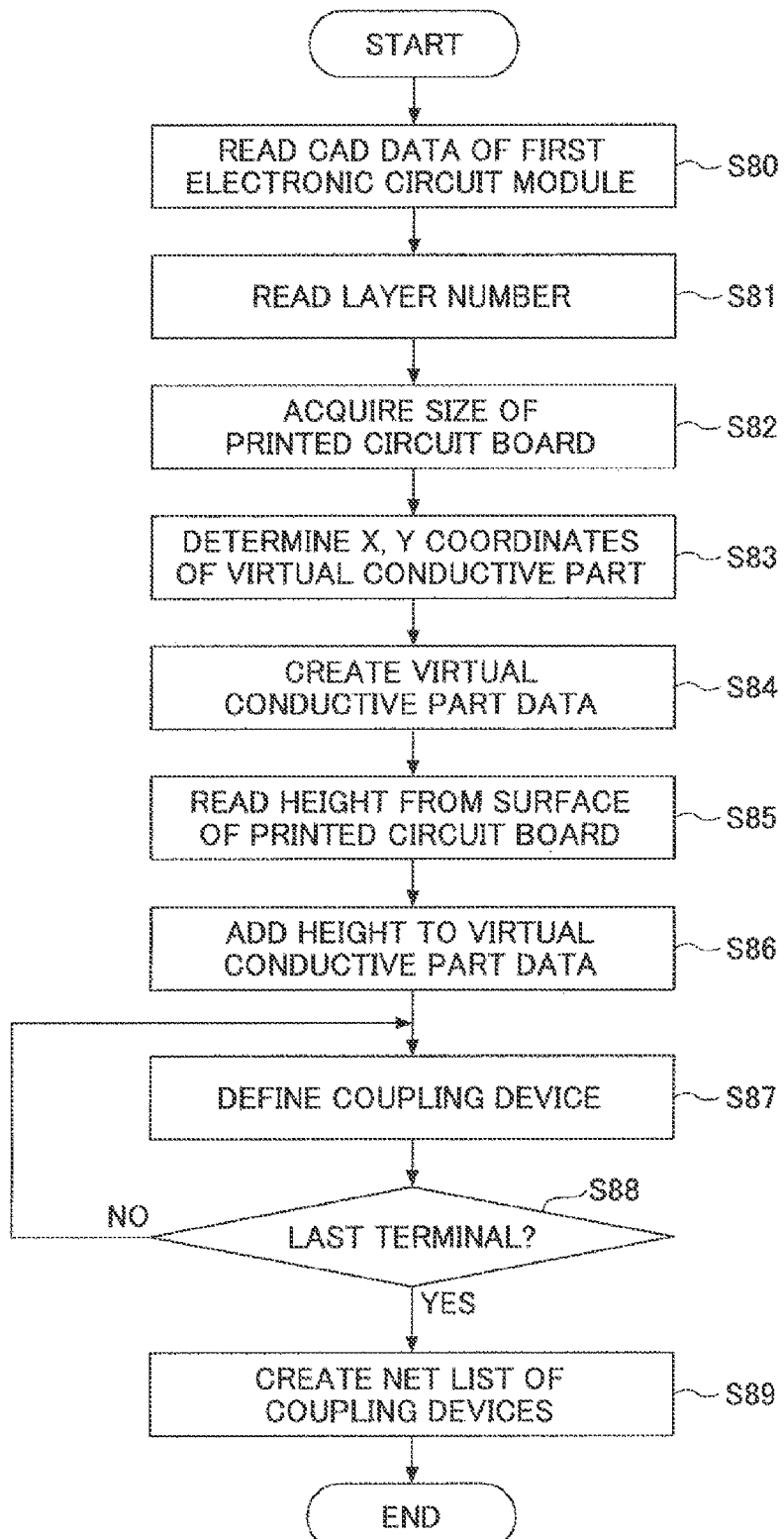
FIG. 27 is a flowchart of a process for generating a virtual conductive part and coupling devices in the coupled analysis simulation apparatus according to the third embodiment of the present invention.

FIG. 27 is a flowchart of a process for generating a virtual conductive part and coupling devices in the coupled analysis simulation apparatus according to the third embodiment of the present invention. The process illustrated in FIG. 27 is what the main control unit 211 inside the CPU 21 causes the virtual conductive part generating unit 214 and the virtual connection part generating unit 215 to execute. This process is executed according to analysis conditions created by the analysis condition creating unit 213.

When the main control unit 211 starts the flow of the process, the virtual conductive part generating unit 214 reads the CAD data (see FIG. 4C) corresponding to the electronic circuit module having the lowest identifier number among the electronic circuit modules included in the analysis conditions (step S80).

Next, the virtual conductive part generating unit 214 reads the layer number of the conductive layer 35 on which the electronic circuit module (CAD data) read in step S80 is mounted (step S81). For example, when the electronic circuit module of the corresponding identifier (No.) in the CAD data indicated in FIG. 4C has a layer number of 1, the virtual conductive part generating unit 214 recognizes that this electronic circuit module is mounted on the topmost layer. When the electronic circuit module of the corresponding identifier (No.) in the CAD data indicated in FIG. 4C has a layer number of 4, the virtual conductive part generating unit 214 recognizes that this electronic circuit module is mounted on the bottommost layer. When the electronic circuit module specified in the analysis conditions has an identifier of 1, and this identifier corresponds to the identifier of the LSI 36 illustrated in FIG. 5A, the layer number of the LSI 36 is read, so that the virtual conductive part generating unit 214 recognizes whether the LSI 36 is mounted on the conductive layer 35A that is the topmost layer or the conductive layer 35D that is the bottommost layer.

The virtual conductive part generating unit 214 reads the size of the printed circuit board (step S82). In the third embodiment, the printed circuit board 34 is a rectangle in a planar view. Therefore, the virtual conductive part generating unit 214 reads the X, Y coordinates of four vertices from the data indicated in FIG. 26.

The virtual conductive part generating unit 214 determines the values of Xmax, Xmin, Ymax, and Ymin (step S83). Accordingly, the X, Y coordinates (Xmin, Ymin), (Xmin, Ymax), (Xmax, Ymin), and (Xmax, Ymax) of the four vertices of the printed circuit board 34 are determined as coordinates of the four vertices of the virtual conductive part 310.

The virtual conductive part generating unit 214 creates virtual conductive part data, by associating the coordinates of the four vertices determined in step S83 with the identifier of the virtual conductive part 310 (step S84). The virtual conductive part data is obtained by associating the identifier, the X, Y coordinate values of the vertices, and the height of the virtual conductive part 310, as in the CAD data.

Next, the virtual conductive part generating unit 214 reads the height (h) of the electronic circuit module 310 included in the analysis conditions (step S85). This step is performed to set a value created by the analysis condition creating unit 213 in advance as the height of the virtual conductive part 310 from the front surface (or back surface) of the printed circuit board 34.

Next, the virtual conductive part generating unit 214 adds, to the virtual conductive part data, the layer number read in step S81 and the height of the virtual conductive part 310 read in step S85 (step S86). When the virtual conductive part generating unit 214 has recognized that the corresponding conductive layer 35 is the topmost layer in step S81, the height of the virtual conductive part 210 is registered as +h. When the virtual conductive part generating unit 214 has recognized that the corresponding conductive layer 35 is the bottommost layer in step S81, the height of the virtual conductive part 210 is registered as −h.

The layer number is registered as data for expressing the layer on which the electronic circuit module is mounted.

Next, the virtual connection part generating unit 215 defines the coupling device 300 (step S87). In the coupled analysis simulation apparatus according to the third embodiment of the present invention, each coupling device 300 is defined to be at a position of one of the terminals included in the analysis conditions. The coupling device 300 is a virtual connection part that virtually connects the conductive layers 35 to the virtual conductive part 310. Thus, the positions of both terminals of the coupling device 300, which is a two-terminal device, are identified. This identification is done by associating the X, Y coordinates of the terminal included in the analysis conditions among the terminals included in the CAD data indicated in FIG. 4C, with the layer number and height of the virtual conductive part 310 registered in step S86. In the coupled analysis simulation apparatus according to the third embodiment of the present invention, the coupling device 300 is defined by associating the identifier of the coupling device 300, X, Y coordinates, the layer number, and the height.

Specifically, the virtual connection part generating unit 215 sequentially reads the X, Y, coordinates of the terminals included in the analysis conditions one by one starting from the smallest terminal number. In step S87, the virtual connection part generating unit 215 associates the X, Y coordinates of the corresponding terminal with the layer number and the height of the virtual conductive part 310 registered in step S86, and gives an identifier to the coupling device 300.

The height of the coupling device 300 is expressed by +h or −h; +h is the height between the coupling device 300 and the topmost conductive layer 35, and −h is the height between the coupling device 300 and the bottommost conductive layer 35. The layer number expresses whether the position where the coupling device 300 is defined is on the topmost layer or the bottommost layer.

The virtual connection part generating unit 215 determines whether the terminal defining the coupling device 300 processed in step S87 is the last terminal (step S88). The terminals included in the analysis conditions are selected one by one starting from the smallest terminal number to define each coupling device, and the selected terminal is processed in step S87. Therefore, step S87 is repeatedly performed until it is determined in step S88 that the processed terminal is the last terminal.

As the process of step S87 is repeated, multiple coupling device data items are created, in which the identifier of the coupling device 300, the X, Y coordinates, and the height are associated with each other.

Next, the virtual connection part generating unit 215 creates a net list of the coupling devices 300 (step S89).

When the virtual connection part generating unit 215 has created a net list in step S89, the series of steps for defining the virtual conductive part 310 and the coupling devices 300 is ended.

Next, a description is given of a signal pathway reproduced by the electronic circuit module according to the third embodiment of the present invention.

Figure 28A:
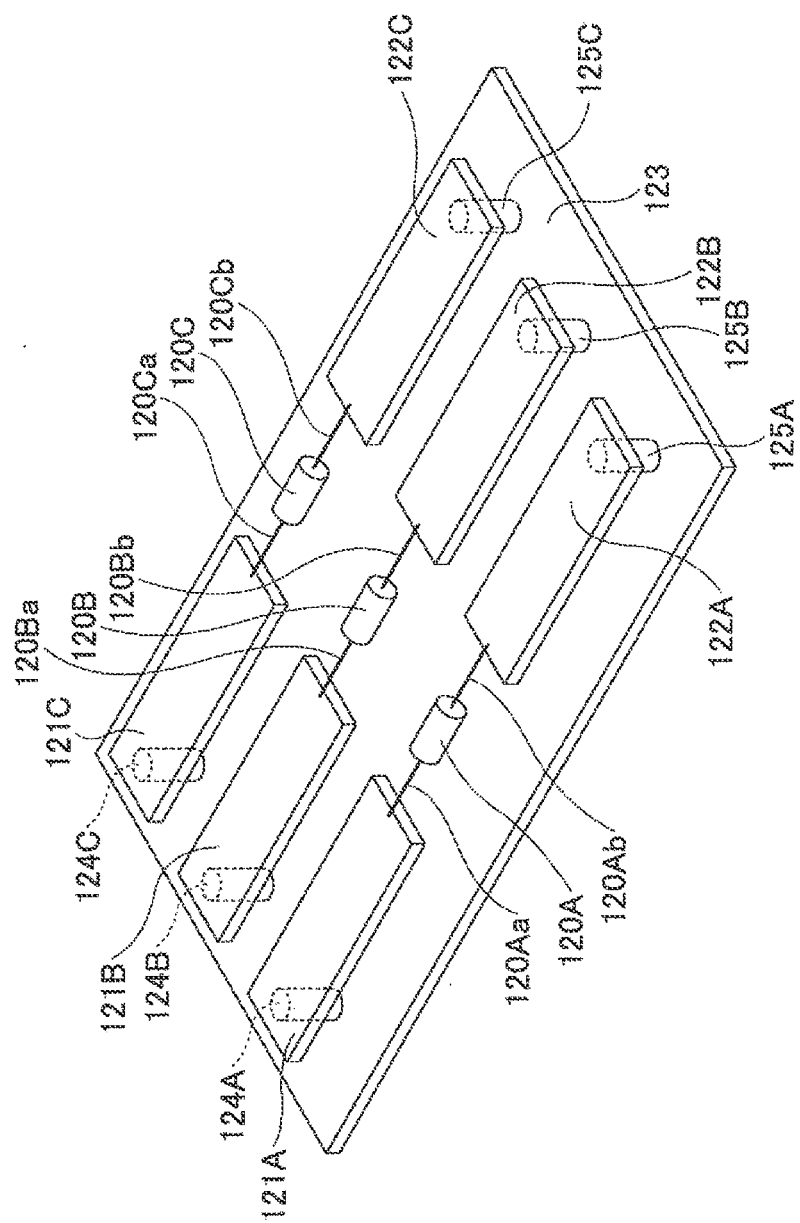
FIG. 28A is a perspective view of a part of a circuit in which electronic circuit modules are mounted.

FIG. 28A is a perspective view of a part of a circuit in which electronic circuit modules are mounted. The circuit illustrated in FIG. 28A includes electronic circuit modules 120A through 120C, wirings 121A through 121C and 122A through 122C, a ground layer 123, input ports 124A through 124C, and output ports 125A through 125C. This is the same circuit as that illustrated in FIG. 19A of the first embodiment.

Figure 28B:
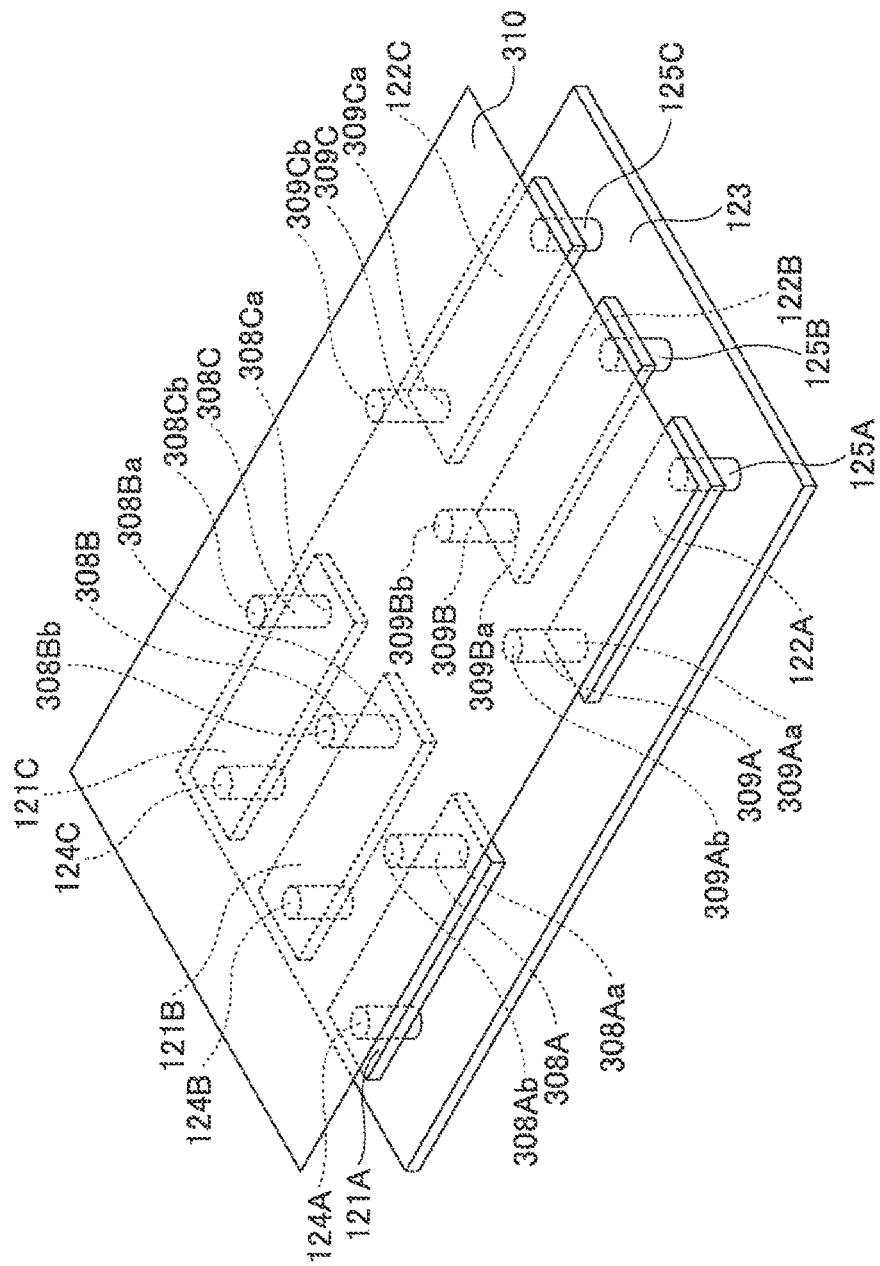
FIG. 28B is a perspective view of the circuit of FIG. 28A, in which virtual conductive parts and coupling devices are disposed in the circuit.

FIG. 28B is a perspective view of the circuit of FIG. 28A, in which circuit virtual conductive parts and coupling devices are disposed. In FIG. 28B, virtual coupling devices 308A through 108C and 309A through 309C are disposed, and the virtual conductive part 310 is disposed instead of the electronic circuit modules 120A through 120C illustrated in FIG. 28A.

The virtual coupling devices 308A through 108C and 309A through 309C are basically the same as the coupling devices 108A through 108C and 109A through 109C illustrated in FIG. 19B in the first embodiment. The virtual coupling devices 308A through 308C and 309A through 309C include terminals 308Aa through 308Ca and 309Aa through 309Ca that are connected to the wirings 121A through 121C and 122A through 122C, and terminals 308Ab through 308Cb and 309Ab through 309Cb that are connected to the virtual conductive part 310.

FIG. 28B illustrates only the coupling devices 308A through 308C and 309A through 309C; however, there may be coupling devices other than the coupling devices 308A through 308C and 309A through 309C when more terminals of electronic circuit modules are specified in the analysis conditions. All coupling devices generated according to the analysis conditions are connected to the virtual conductive part 310.

The virtual conductive part 310 is defined to have a planar shape that is the same size as the printed circuit board 34 in a planar view, and a height specified in the analysis conditions. The virtual conductive part 310 is connected to the terminals 308Ab through 308Cb and 309Ab through 309Cb of the coupling devices 308A through 308C and 309A through 309C.

FIG. 29 illustrates a return path reproduced on the circuit illustrated in FIG. 28B by the coupled analysis simulation apparatus according to the third embodiment of the present invention. The return path is displayed as analysis results of the coupled analysis simulation apparatus according to the third embodiment, on the display screen 12A of the display 12 illustrated in FIG. 1, by the analysis result display processing unit 218 (see FIG. 6).

The return path illustrated in FIG. 29 is reproduced on the surface of the ground layer 123, when signals are input to the electronic circuit modules 120A and 120C illustrated in FIG. 28A, but not input to the electronic circuit module 120B. The return path is indicated by dots in FIG. 29. The higher the density of the dots, the higher the current values. The lower the density of the dots, the lower the current values. In FIG. 29, elements except for the ground layer 123 are illustrated with dotted lines so that the return path is clearly viewable.

As illustrated in FIG. 29, the return path extends on the surface of the ground layer 123, along the wiring 121A, the virtual conductive part 310, the wiring 122A, the wiring 121C, the virtual conductive part 310, and the wiring 122C. The return path illustrated in FIG. 29 is different from that of the coupled analysis simulation apparatus according to the first embodiment in that a slight current expressed by dots of low density is flowing between the wirings 121A and 121C and between the wirings 122A through 122C; however, the return path of FIG. 29 is accurately reproduced on the circuit illustrated in FIG. 29.

The coupled analysis simulation apparatus according to the third embodiment of the present invention uses the virtual conductive part 310 and the coupling devices 300 that are generated by modeling the electronic circuit modules and terminals. Therefore, the coupled analysis is performed on the electronic circuit modules in a state that is similar to the actual state in which the electronic circuit modules are actually connected to the conductive layers 35. Particularly, the electromagnetic field analysis involves processes of calculating the electric fields and magnetic fields of cells in the analysis model including the virtual conductive part 310 and the coupling devices 300. Thus, it is possible to reproduce, with high precision, the electric fields and magnetic fields of the cells where the electronic circuit modules are actually positioned. Furthermore, based on the magnetic field that has been reproduced with high precision, it is possible to obtain, with high precision, the current value of the coupling devices 300 to be transferred to (applied to) the circuit analysis.

Accordingly, with the coupled analysis simulation apparatus according to the third embodiment of the present invention, it is possible to accurately reproduce the return path, similar to the coupled analysis simulation apparatuses according to the first and second embodiments of the present invention.

Furthermore, in the third embodiment, the virtual conductive part 310 having the same size as the printed circuit board 34 in a planar view is generated as a virtual conductive part common to all electronic circuit modules mounted on the printed circuit board 34. Therefore, in the third embodiment, the process for generating the virtual conductive part 310 is further simplified than that of the first and second embodiments. Accordingly, in the third embodiment, it is possible perform coupled analysis with fewer calculation steps compared to the first and second embodiments.

Furthermore, in the coupled analysis simulation apparatus according to the third embodiment of the present invention, all of the coupling devices 300 are connected to the virtual conductive part 310, and therefore there is no need to determine where the coupling devices 300 are to be connected.

Therefore, even when the electronic circuit modules have a large number of terminals, and it is thus difficult to recognize the current pathway inside the electronic circuit modules, the connection process is completed simply by connecting all of the coupling devices 300 to the virtual conductive part 310. Accordingly, the process of modeling the electronic circuit module and terminals is very simple.

Furthermore, in the conventional technology, even if it is correctly determined where the coupling devices are to be connected, the following problem may arise. That is, there may be cases where there are so many terminals that it is difficult to properly connect the coupling devices. Meanwhile, with the coupled analysis simulation apparatus according to the third embodiment of the present invention, the connection process is completed simply by connecting all of the coupling devices 300 to the virtual conductive part 310, and therefore the connection process of the coupling devices 300 is very simple. Accordingly, the return path is accurately reproduced.

In the third embodiment, the printed circuit board 34 has a rectangular shape in a planar view; however, when the printed circuit board 34 is not a rectangle, the size of the virtual conductive part 310 may be defined so as to cover the entire printed circuit board 34 in a planar view.

In the first to third embodiments described above, the FDTD method is used for electromagnetic field analysis; however, the electromagnetic field analysis is not limited to the FDTD method. The electromagnetic field analysis may be performed by any calculation method for deriving the variation in the time-domain of the electromagnetic field, such as a moment method and a TLM method.

According to one embodiment of the present invention, a coupled analysis simulation apparatus, a coupled analysis simulation method, and a computer-readable recording medium are provided, with which electronic circuit modules and connection parts are easily modeled and a return path is accurately reproduced.

The coupled analysis simulation apparatus, the coupled analysis simulation method, and the computer-readable recording medium according to the present invention are not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A coupled analysis simulation apparatus comprising:
   a coupled analysis processing unit configured to perform coupled analysis by performing electromagnetic field analysis and circuit analysis in coordination with each other, the electromagnetic field analysis being performed on a space including conductive layers to which an electronic circuit module is connected, the circuit analysis being performed on the electronic circuit module;
   a first generating unit configured to generate a virtual conductive part in a section or a region including connection parts connecting the electronic circuit module with the conductive layers by determining vertices of the virtual conductive part in comparison with coordinates of the connection parts; and
   a second generating unit configured to generate virtual connection parts that virtually connect the virtual conductive part with the conductive layers at positions where the connection parts are connected to the conductive layers;
   wherein a height of the virtual conductive part is set to have a predetermined height in relation with one of the conductive layers.

2. The coupled analysis simulation apparatus according to claim 1, further comprising:
   an electromagnetic field analysis processing unit configured to perform the electromagnetic field analysis on the region where the virtual conductive part, the virtual connection parts, and the conductive layers are positioned, to obtain a magnetic field of the region including the virtual connection parts based on an electric field value of the region including the virtual connection parts.

3. The coupled analysis simulation apparatus according to claim 2, further comprising:
   a current processing unit configured to obtain a current value of the virtual connection parts based on the magnetic field obtained by the electromagnetic field analysis processing unit.

4. The coupled analysis simulation apparatus according to claim 3, further comprising:

a current transfer processing unit configured to transfer the current value obtained by the current processing unit to a circuit analysis processing unit.

5. The coupled analysis simulation apparatus according to claim 4, wherein the circuit analysis processing unit is configured to obtain a voltage value of the virtual connection parts by performing the circuit analysis on the electronic circuit module with the use of the current value received from the current transfer processing unit.

6. The coupled analysis simulation apparatus according to claim 5, further comprising:
an electric field processing unit configured to obtain the electric field value of the region including the virtual connection parts based on the voltage value of the virtual connection parts obtained by the circuit analysis processing unit.

7. The coupled analysis simulation apparatus according to claim 6, further comprising:
an electric field transfer unit configured to transfer the electric field value obtained by the electric field processing unit to the electromagnetic field analysis processing unit.

8. The coupled analysis simulation apparatus according to claim 1, wherein at least one of the virtual conductive part and the virtual connection parts are generated as a perfect conductor.

9. The coupled analysis simulation apparatus according to claim 1, further comprising:
an analysis condition creating unit configured to create analysis conditions including two or more of the connection parts connecting the electronic circuit module with the conductive layers.

10. The coupled analysis simulation apparatus according to claim 9, wherein
the first generating unit generates the virtual conductive part in the section or the region including the two or more of the connection parts that are included in the analysis conditions, and
the second generating unit generates the virtual connection parts at the positions of the two or more of the connection parts that are included in the analysis conditions.

11. The coupled analysis simulation apparatus according to claim 1, further comprising:
an analysis condition creating unit configured to create analysis conditions including two or more of the electronic circuit modules.

12. The coupled analysis simulation apparatus according to claim 11, wherein
the first generating unit generates the virtual conductive part in the section or the region including the connection parts connecting the two or more of the electronic circuit modules included in the analysis conditions with the conductive layers, and
the second generating unit generates the virtual connection parts at the positions of the connection parts connected to the two or more of the electronic circuit modules that are included in the analysis conditions.

13. The coupled analysis simulation apparatus according to claim 1, wherein the first generating unit generates a plurality of the virtual conductive parts for corresponding ones of a plurality of the electronic circuit modules.

14. The coupled analysis simulation apparatus according to claim 1, wherein the first generating unit generates the virtual conductive part that is common to a plurality of the electronic circuit modules.

15. The coupled analysis simulation apparatus according to claim 14, wherein the virtual conductive part has the same size as a printed circuit board including the conductive layers.

16. The coupled analysis simulation apparatus according to claim 1, wherein the height of the virtual conductive part from one of the conductive layers is set as the same as a height of the electronic circuit module from the one of the conductive layers.

17. The coupled analysis simulation apparatus according to claim 1, wherein the height of the virtual conductive part from one of the conductive layers is set as a predetermined height that is set in advance.

18. A coupled analysis simulation method executed by a computer, the coupled analysis simulation method comprising:
performing coupled analysis by performing electromagnetic field analysis and circuit analysis in coordination with each other, the electromagnetic field analysis being performed on a space including conductive layers to which an electronic circuit module is connected, the circuit analysis being performed on the electronic circuit module;
generating a virtual conductive part in a section or a region including connection parts connecting the electronic circuit module with the conductive layers by determining vertices of the virtual conductive part in comparison with coordinates of the connection parts;
generating virtual connection parts that virtually connect the virtual conductive part with the conductive layers at positions where the connection parts are connected to the conductive layers; and
setting a height of the virtual conductive part to have a predetermined height in relation with one of the conductive layers.

19. The coupled analysis simulation method according to claim 18, further comprising:
performing the electromagnetic field analysis on the region where the virtual conductive part, the virtual connection parts, and the conductive layers are positioned, to obtain a magnetic field of the region including the virtual connection parts based on an electric field value of the region including the virtual connection parts;
obtaining a current value of the virtual connection parts based on the magnetic field obtained at the performing the electromagnetic field analysis;
transferring the current value obtained at the obtaining the current value so that the current value is used for obtaining a voltage value of the virtual connection parts;
obtaining the voltage value of the virtual connection parts by performing the circuit analysis on the electronic circuit module with the use of the current value received by the transferring the current value;
obtaining the electric field value of the region including the virtual connection parts based on the voltage value of the virtual connection parts obtained at the obtaining the voltage value; and
transferring the electric field value obtained at the obtaining the electric field value so that the electric field value is used for the performing the electromagnetic field analysis.

20. A non-transitory computer-readable recording medium recording a coupled analysis simulation program that causes a computer to function as:
a coupled analysis processing unit configured to perform coupled analysis by performing electromagnetic field analysis and circuit analysis in coordination with each other, the electromagnetic field analysis being performed on a space including conductive layers to which an electronic circuit module is connected, the circuit analysis being performed on the electronic circuit module;

a first generating unit configured to generate a virtual conductive part in a section or a region including connection parts connecting the electronic circuit module with the conductive layers by determining vertices of the virtual conductive part in comparison with coordinates of the connection parts;

a second generating unit configured to generate virtual connection parts that virtually connect the virtual conductive part with the conductive layers at positions where the connection parts are connected to the conductive layers; and a setting unit configured to set a height of the virtual conductive part to have a predetermined height in relation with one of the conductive layers.

* * * * *